(12) United States Patent
Onozawa et al.

(10) Patent No.: US 9,773,923 B2
(45) Date of Patent: Sep. 26, 2017

(54) SEMICONDUCTOR DEVICE

(71) Applicant: FUJI ELECTRIC CO., LTD., Kawasaki-shi (JP)

(72) Inventors: Yuichi Onozawa, Matsumoto (JP); Takashi Yoshimura, Matsumoto (JP); Hiroshi Takishita, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/821,571

(22) Filed: Aug. 7, 2015

(65) Prior Publication Data

US 2015/0364613 A1 Dec. 17, 2015

Related U.S. Application Data

(63) Continuation of application No. PCT/JP2014/057397, filed on Mar. 18, 2014.

(30) Foreign Application Priority Data

Mar. 25, 2013 (JP) ................................. 2013-061508

(51) Int. Cl.
*H01L 29/872* (2006.01)
*H01L 29/861* (2006.01)
(Continued)

(52) U.S. Cl.
CPC .......... *H01L 29/872* (2013.01); *H01L 21/221* (2013.01); *H01L 21/225* (2013.01);
(Continued)

(58) Field of Classification Search
CPC ........... H01L 29/66325; H01L 29/0619; H01L 29/0623; H01L 29/0626; H01L 21/221;
(Continued)

(56) References Cited

U.S. PATENT DOCUMENTS 7,635,909 B2    12/2009   Mauder et al.
7,842,590 B2    11/2010   Gutt et al.
(Continued)

FOREIGN PATENT DOCUMENTS

EP          1909332 A1    4/2008
JP      2007-324601 A   12/2007
(Continued)

OTHER PUBLICATIONS

D.B.M.Klaassen, "A Unified Mobility Model for Device Simulation-II. Temperature Dependence of Carrier Mobility and Lifetime", Solid State Electronics, vol. 35, No. 7, Jul. 1, 1992 (1992-87-81), pp. 961-967.

(Continued)

*Primary Examiner* — Christine Enad
(74) *Attorney, Agent, or Firm* — Rabin & Berdo, P.C.

(57) ABSTRACT

Provided is a semiconductor device and a method for forming the same. The device has a substrate including one and another surfaces. A first semiconductor region of a first conductivity type is formed in the substrate. A second conductivity type, second semiconductor region is provided in a first surface layer, that includes the one surface, of the substrate. A first electrode is in contact with the second semiconductor region to form a junction therebetween. A first conductivity type, third semiconductor region is provided in a second surface layer, that includes the another surface, of the substrate. The third semiconductor region has a higher impurity concentration than the first semiconductor region. A fourth semiconductor region of the second conductivity type is provided in the first semiconductor region at a location deeper than the third semiconductor region from the another surface. A second electrode is in contact with the third semiconductor region.

21 Claims, 30 Drawing Sheets

(51) Int. Cl.
*H01L 29/06* (2006.01)
*H01L 21/225* (2006.01)
*H01L 21/263* (2006.01)
*H01L 21/304* (2006.01)
*H01L 29/66* (2006.01)
*H01L 21/22* (2006.01)
*H01L 21/265* (2006.01)
*H01L 29/32* (2006.01)
*H01L 29/36* (2006.01)
*H01L 21/268* (2006.01)
*H01L 21/324* (2006.01)

(52) U.S. Cl.
CPC ........ *H01L 21/2253* (2013.01); *H01L 21/263* (2013.01); *H01L 21/2636* (2013.01); *H01L 21/26506* (2013.01); *H01L 21/304* (2013.01); *H01L 29/0619* (2013.01); *H01L 29/0623* (2013.01); *H01L 29/32* (2013.01); *H01L 29/66143* (2013.01); *H01L 29/8611* (2013.01); *H01L 21/268* (2013.01); *H01L 21/324* (2013.01); *H01L 29/0626* (2013.01); *H01L 29/36* (2013.01)

(58) Field of Classification Search
CPC . H01L 21/225; H01L 21/2253; H01L 21/263; H01L 21/2636; H01L 21/304
See application file for complete search history.

(56) References Cited

U.S. PATENT DOCUMENTS

| | | | |
|---|---|---|---|
| 2007/0278472 A1 | 12/2007 | Mauder et al. | |
| 2008/0315364 A1 | 12/2008 | Nemoto | |
| 2009/0267200 A1 | 10/2009 | Gutt et al. | |
| 2009/0289276 A1* | 11/2009 | Yoshiura | H01L 29/0619 257/133 |
| 2010/0308446 A1 | 12/2010 | Nakamura | |
| 2012/0007141 A1* | 1/2012 | Soeno | H01L 27/0664 257/140 |
| 2012/0077304 A1* | 3/2012 | Tomita | H01L 27/14683 438/89 |
| 2012/0193676 A1* | 8/2012 | Bobde | H01L 29/7391 257/140 |
| 2012/0267681 A1 | 10/2012 | Nemoto et al. | |
| 2012/0309208 A1* | 12/2012 | Tanida | H01L 21/268 438/795 |

FOREIGN PATENT DOCUMENTS

| | | |
|---|---|---|
| JP | 2009-283781 A | 12/2009 |
| JP | 2010-283132 A | 12/2010 |
| JP | 2011-003727 A | 1/2011 |
| WO | WO-2007/055352 A1 | 5/2007 |

OTHER PUBLICATIONS

Min Chen et al, "A Novel Diode Structure with Controlled Injection of Backside Holes (CIBH)", Proceedings of the 18th International Symposium on Power Semiconductor Devices & ICs; Jun. 4-8, 2006; Naples, Italy. (IEEE CAT. No. 06CH37817C), IEEE Operations Center, Piscataway, NJ, USA, Jun. 4, 2006, pp. 1-4.

Ralf Siemieniec et al, "Possibilities and limits of axial lifetime control by radiation induced centers in fast recovery diodes", Microelectronics Journal, Mackintosh Publications Ltd. Luton, GB, vol. 35, No. 3, Mar. 1, 2004 (Mar. 1, 2004), pp. 259-267, XP004487513.

* cited by examiner

SEMICONDUCTOR DEVICE

This application is a continuation under 35 U.S.C. 120 of International Application PCT/JP2014/057397 having the International Filing Date of Mar. 18, 2014, and having the benefit of the earlier filing date of Japanese Application No. 2013-061508, filed Mar. 25, 2013. Each of the identified applications is fully incorporated herein by reference.

TECHNICAL FIELD

The present invention relates to a semiconductor device.

BACKGROUND ART

With the development of a technique for reducing the power consumption of power conversion apparatuses, there are growing expectations for a technique for reducing the power consumption of a power device which plays a key role in the power conversion apparatus. For example, among various types of power devices, an insulated gate bipolar transistor (IGBT) has been generally used which can reduce the on-voltage using the conductivity modulation effect and whose operation is easily controlled by the control of a voltage-driven gate. The use of the IGBT makes it possible to ensure a high breakdown voltage and to significantly improve a switching speed even in a power device provided in a circuit area in which a large amount of current flows.

However, with an increase in the switching speed, EMI (Electro Magnetic Interference) noise problems have emerged. In particular, it is necessary to suppress the EMI noise to an allowable level when the IGBT is turned on. As a result, an increase in the switching speed is limited and it is difficult to sufficiently reduce switching loss. It is important to achieve a soft recovery free wheeling diode (FWD) which is combined with the IGBT in order to reduce the EMI noise.

In order to achieve the soft recovery FWD, it is necessary to reduce the carrier density of an anode to reduce a reverse recovery current during reverse recovery. In addition, it is necessary to increase the carrier density of a cathode in order to suppress the oscillation of a voltage-current waveform due to the depletion of the carriers. As a structure in which the carrier density of the anode is low and the carrier density of the cathode is high, the following structures have been known: an anode structure with low injection efficiency; a structure in which a Schottky diode is locally arranged; and a structure which controls a local lifetime to optimize a carrier distribution.

In recent years, as another structure in which the carrier density of the anode is low and the carrier density of the cathode is high, a structure has been proposed which forms a floating buried p layer on the cathode side, avalanches a pn diode on the cathode side when a high voltage is applied, and forcedly increases the carrier density of the cathode to achieve soft recovery (for example, see the following Patent Documents 1 and 2). The FWD according to the related art disclosed in the following Patent Documents 1 and 2 will be described with reference to FIG. 29. FIG. 29 is a cross-sectional view illustrating the structure of the FWD according to the related art.

As illustrated in FIG. 29, the FWD according to the related art includes an active region 100 and an edge termination structure portion (edge portion) 110 surrounding the active region 100, which are provided in an n⁻ semiconductor substrate that will be an n⁻ drift region 101. A p⁺ anode layer 102 is provided in a surface layer of the front surface of the n⁻ semiconductor substrate in the active region 100. A field limiting ring (FLR) 108 is provided in a floating p-type region in the edge termination structure portion 110. An interlayer insulating film 109 covers the front surface of the n⁻ semiconductor substrate in the edge termination structure portion 110. An anode electrode 103 is provided on the surface of the p⁺ anode layer 102 and has an end portion which extends onto the interlayer insulating film 109.

An n⁺ cathode layer 104 is provided in a surface layer of the rear surface of the n⁻ semiconductor substrate so as to extend from the active region 100 to the edge termination structure portion 110. An n buffer layer 105 is provided between the n⁻ drift region 101 and the n⁺ cathode layer 104 so as to extend from the active region 100 to the edge termination structure portion 110. A plurality of buried p layers 106 are provided in a surface layer of the n buffer layer 105 which is close to the n⁺ cathode layer 104 at predetermined intervals so as to extend from the active region 100 to the edge termination structure portion 110. The buried p layer 106 comes into contact with the n⁺ cathode layer 104. A cathode electrode 107 is provided on the entire rear surface of the n⁻ semiconductor substrate.

As another FWD, a device has been proposed which includes a first electrode, a first layer of a first conductivity type that is provided on the first electrode, a second layer that is a second conductivity type different from the first conductivity type and is provided on the first layer, a third layer that is provided on the second layer, a second electrode that is provided on the third layer, and a fourth layer that is the second conductivity type and is provided between the second layer and the third layer. In the device, the third layer includes a first portion which is the second conductivity type and has an impurity concentration peak value greater than the impurity concentration peak value of the second layer and a second portion of the first conductivity type. The ratio of the area of the second portion to the total area of the first and second portions is equal to or greater than 90% and equal to or less than 95% (for example, see the following Patent Document 3).

CITATION LIST

Patent Document

Patent Document 1: U.S. Pat. No. 7,635,909
Patent Document 2: U.S. Pat. No. 7,842,590
Patent Document 3: JP 2010-283132 A

DISCLOSURE OF THE INVENTION

Problem to be Solved by the Invention

However, the problems caused by an increase in the switching speed include the problem that the maximum voltage which is applied during the reverse recovery of the FWD or a current change rate di/dt exceeds a safe operating area (SOA), which results in element breakdown, in addition to the EMI noise problem. For example, one of the causes of the element breakdown is that the carriers which are spread in an inactive region (for example, the edge termination structure portion) when the FWD is turned on move to the anode electrode through a contact of the active region (a junction between the p⁺ anode layer and the anode electrode) during reverse recovery and a current is concentrated on an outer circumferential portion of the active region. Another example of the cause of the element breakdown is that the electric field intensity of the p+ anode layer increases due to the curvature of an end portion of the p+ anode layer. This problem is not solved by the soft recovery of the FWD.

In the techniques disclosed in Patent Documents 1 and 2 illustrated in FIG. 29, ion implantation is performed on the rear surface of the substrate, using an ion implantation mask which is formed on the rear surface of the substrate by photolithography as a mask, to form the plurality of buried p layers 106. In this case, when the ion implantation mask is patterned, alignment is performed on the rear surface of the substrate on the basis of dicing lines on the front surface of the substrate. For example, a chip which is formed on a wafer with a diameter of 6 inches has a chip size of about 1 cm×1 cm and the width of the edge termination structure portion 110 is in the range of about 0.1 mm to 1 mm. Therefore, the width of the active region 100 is in the range of about 9 mm to 9.9 mm. Therefore, alignment accuracy on the rear surface of the substrate needs to be high in order to form a plurality of buried p layers 106 in the active region 100 and the edge termination structure portion 110 in a fine pattern with high dimension accuracy according to a design.

As a method for improving alignment accuracy on the rear surface of the substrate, a method has been known which places an n− semiconductor substrate on a transparent stage, with the front surface down and radiates infrared rays from the stage to the n− semiconductor substrate to detect the dicing lines in the front surface of the substrate. However, this method requires a special device for detecting the dicing lines in the front surface of the n− semiconductor substrate from the rear surface of the n− semiconductor substrate. Therefore, this method has the problem that costs increase.

The invention has been made in order to solve the above-mentioned problems of the related art and an object of the invention is to provide a semiconductor device which achieves soft recovery and has a high breakdown voltage during reverse recovery.

Means for Solving Problem

In order to solve the above-mentioned problems and achieve the object of the invention, a semiconductor device according to an aspect of the invention has the following characteristics. A second semiconductor region of a second conductivity type is selectively provided in a surface layer of one surface of a first semiconductor region of a first conductivity type. A first electrode which comes into contact with the second semiconductor region is provided. A third semiconductor region of the first conductivity type which has a higher impurity concentration than that of the first semiconductor region is provided in a surface layer of the other surface of the first semiconductor region. A fourth semiconductor region of the second conductivity type is provided in the first semiconductor region at a position deeper than the third semiconductor region from the other surface of the first semiconductor region. A second electrode which comes into contact with the third semiconductor region is provided. An end portion of the fourth semiconductor region is located inside a side surface of the first semiconductor region.

In the semiconductor device according to the above-mentioned aspect of the invention, the end portion of the fourth semiconductor region may be located inside an end portion of a junction between the second semiconductor region and the first electrode.

The semiconductor device according to the above-mentioned aspect of the invention may further include a fifth semiconductor region of the first conductivity type which is provided in the first semiconductor region so as to extend from the other surface of the first semiconductor region to a position deeper than the third semiconductor region and has an impurity concentration that is higher than the impurity concentration of the first semiconductor region and is lower than the impurity concentration of the third semiconductor region. An end portion of the third semiconductor region may be located inside the end portion of the junction. A Schottky junction between the fifth semiconductor region and the second electrode may be formed outside the third semiconductor region.

The semiconductor device according to the above-mentioned aspect of the invention may further include a sixth semiconductor region of the second conductivity type which is provided in the fifth semiconductor region provided outside the third semiconductor region so as to be separated from the third semiconductor region and the fourth semiconductor region.

In the semiconductor device according to the above-mentioned aspect of the invention, the fifth semiconductor region may be formed by a plurality of proton irradiation processes and a plurality of the fifth semiconductor regions may be arranged at different depths from the other surface of the first semiconductor region.

In the semiconductor device according to the above-mentioned aspect of the invention, the occupation area ratio of the surface area of the fourth semiconductor region to the surface area of an active region in which a main current flows may be equal to or greater than 90% and equal to or less than 98%.

In the semiconductor device according to the above-mentioned aspect of the invention, in the occupation area ratio of the surface area of the fourth semiconductor region to the surface area of an active region in which a main current flows, the occupation area ratio on an inner circumferential side of the position of a contact end portion, which is obtained by projecting a contact end portion of a contact region between the first electrode and the second semiconductor region from the one surface to the other surface, may be higher than the occupation area ratio on an outer circumferential side of the position of the contact end portion.

In the semiconductor device according to the above-mentioned aspect of the invention, the length of the fourth semiconductor region, which is disposed on an inner circumferential side of the position of a contact end portion obtained by projecting a contact end portion of a contact region between the first electrode and the second semiconductor region from the one surface to the other surface, in a direction horizontal to the other surface may be equal to or greater than 250 μm.

In the semiconductor device according to the above-mentioned aspect of the invention, a length L1 of the fourth semiconductor region, which is disposed on an inner circumferential side of the position of a contact end portion obtained by projecting a contact end portion of a contact region between the first electrode and the second semiconductor region from the one surface to the other surface, in a direction horizontal to the other surface may satisfy the following expression:

$$L1 \geq \{(q \cdot \mu \cdot d \cdot Np \cdot Vbi)/J\}^{1/2}$$

(where J is the current density of a main current of the semiconductor device, q is an elementary charge, μ is hole mobility, d is the thickness of the fourth semiconductor region in a depth direction, Np is the impurity concentration of the fourth semiconductor region, and Vbi is the built-in potential of a pn junction between the fourth semiconductor region and the third semiconductor region).

In the semiconductor device according to the above-mentioned aspect of the invention, the fourth semiconductor region may be disposed on an inner circumferential side of the position of a contact end portion which is obtained by projecting a contact end portion of a contact region between the first electrode and the second semiconductor region from the one surface to the other surface and the distance of a separation portion between the position of the contact end portion and the end portion of the fourth semiconductor region may be equal to or less than 2000 µm.

According to the invention, the buried p layer (fourth semiconductor region) is uniformly provided and the end portion of the buried p layer is located inside the side surface (chip end portion) of the n⁻ drift region (first semiconductor region). Therefore, during reverse recovery, an avalanche occurs in the pn junction between the buried p layer and the n⁺ cathode layer and holes are injected from the n⁺ cathode layer to the n⁻ drift region. As a result, soft recovery characteristics are obtained. In addition, since a short circuit between the buried p layer and the cathode electrode does not occur in the chip end portion, it is possible to prevent a jump in the current-voltage waveform (I-V waveform).

In addition, according to the invention, since the end portion of the buried p layer is located inside the end portion of an anode contact (a junction between the second semiconductor region and the first electrode), the dynamic breakdown voltage of the active region is less than the dynamic breakdown voltage of an inactive region (for example, the edge termination structure portion). Therefore, it is possible to suppress the concentration of the electric field on the end portion of the anode contact during reverse recovery.

Furthermore, the p⁻ layer which separates the n⁺ cathode layer that extends to the outside of the buried p layer from the chip end portion is provided. Alternatively, the p⁻ layer which is separated from the buried p layer and comes into contact with the cathode electrode is provided on the outer circumferential side of the buried p layer. Therefore, electrons are not injected into the inactive region and the diffusion of carriers to the inactive region is suppressed. As a result, the concentration of a current on the end portion of the p⁺ anode layer (second semiconductor region) is reduced and the breakdown voltage during reverse recovery increases.

Effect of the Invention

According to the semiconductor device of the invention, it is possible to achieve soft recovery and to increase a breakdown voltage during reverse recovery.

MODE(S) FOR CARRYING OUT THE INVENTION

Figure 1:
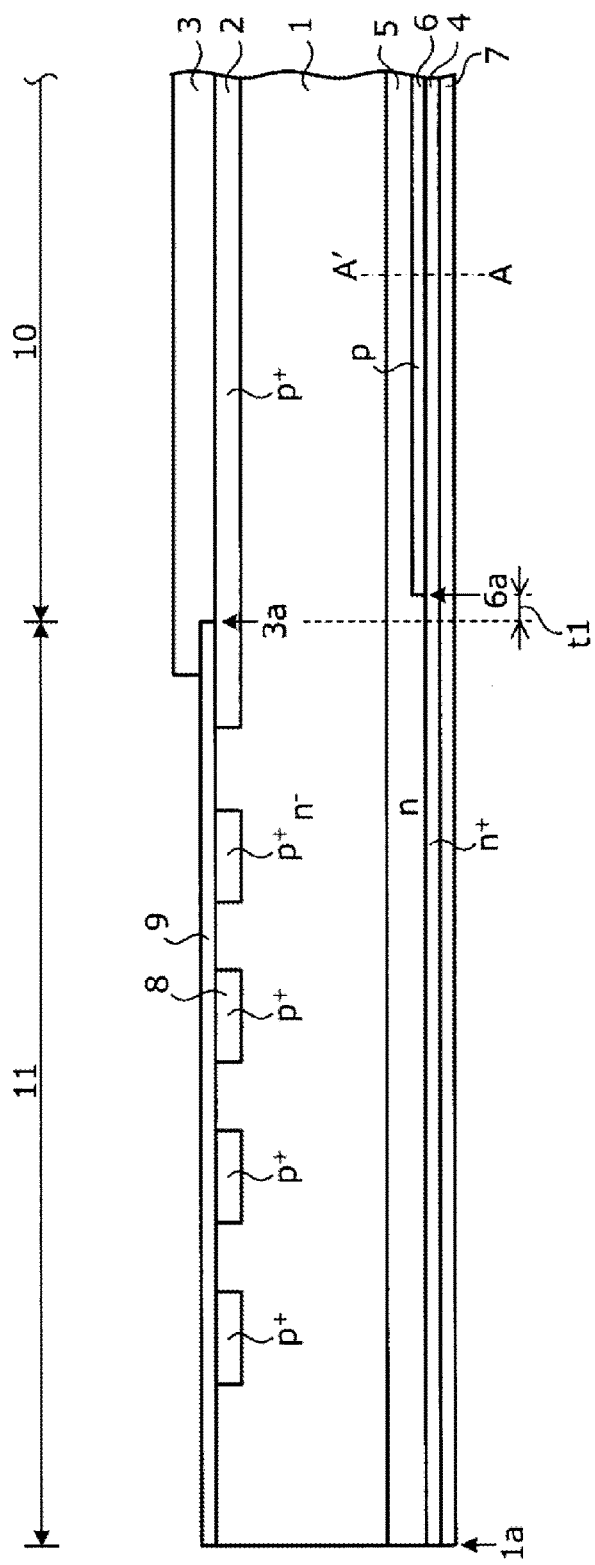
FIG. 1 is a cross-sectional view illustrating the structure of a semiconductor device according to Embodiment 1.

Hereinafter, preferred embodiments of a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

Embodiment 1

Figure 2:
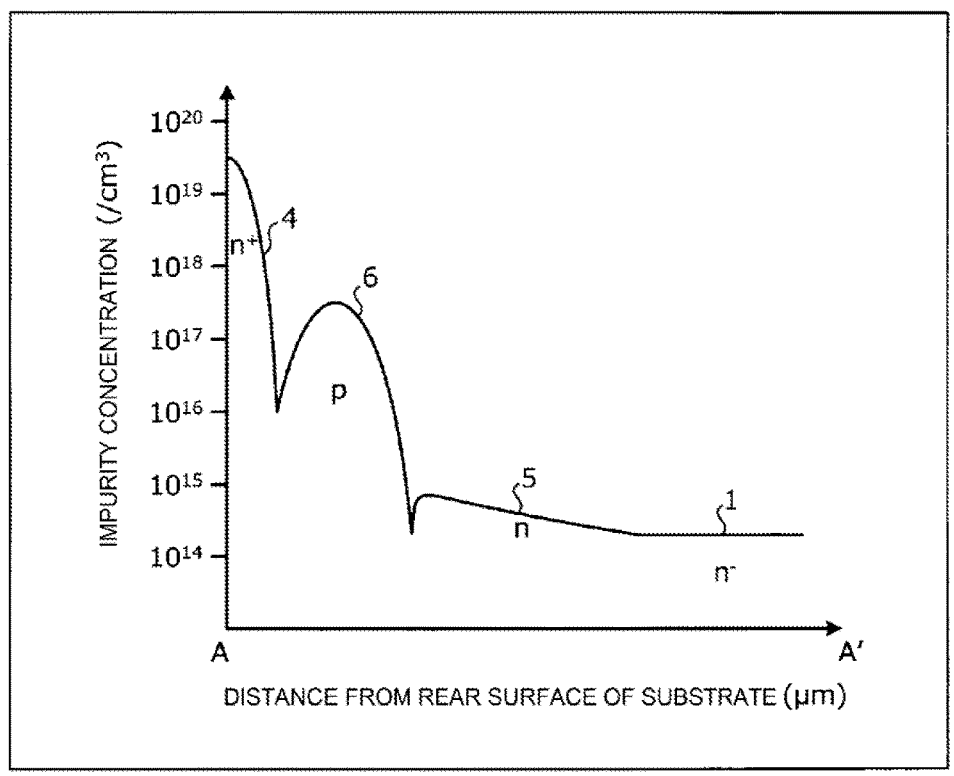
FIG. 2 is a characteristic diagram illustrating an impurity concentration distribution along the cutting line A-A' of FIG. 1.

The structure of a semiconductor device according to Embodiment 1 will be described. FIG. 1 is a cross-sectional view illustrating the structure of the semiconductor device according to Embodiment 1. FIG. 2 is a characteristic diagram illustrating an impurity concentration distribution along the cutting line A-A' of FIG. 1. In FIG. 2, the horizontal axis indicates the distance from the rear surface of a substrate (an interface between an $n^+$ cathode layer 4 and a cathode electrode 7) in the depth direction of the substrate and the vertical axis indicates impurity concentration along the cutting line A-A' which traverses a rear-surface-side region of the substrate in the depth direction (which holds for FIGS. 9 and 13. As illustrated in FIG. 1, the semiconductor device according to Embodiment 1 includes an active region 10 and an edge termination structure portion (edge portion) 11 that surrounds the active region 10, which are provided in an $n^-$ semiconductor substrate that will be an $n^-$ drift region (first semiconductor region) 1. The active region 10 is a region in which a current flows when the semiconductor device is in an on state. The edge termination structure portion 11 has a function of reducing the electric field on the front surface side of the substrate and holding a breakdown voltage.

A $p^+$ anode layer (second semiconductor region) 2 is provided in a surface layer of the front surface of the $n^-$ semiconductor substrate in the active region 10. A field limiting ring (FLR) 8 which is, for example, a floating p-type region is provided in the surface layer of the front surface in the edge termination structure portion 11. The lifetime τp of a minority carrier (hole) in the $n^-$ drift region 1 is controlled to be, for example, equal to or less than 10 μs (non-killer), preferably, equal to or greater than 0.1 μs and equal to or less than 3 μs. An interlayer insulating film 9 covers the front surface of the $n^-$ semiconductor substrate in the edge termination structure portion 11. An inner circumferential end portion of the interlayer insulating film 9 extends onto the surface of the $p^+$ anode layer 2. An anode electrode (first electrode) 3 is provided on the surface of the $p^+$ anode layer 2. An end portion of the anode electrode 3 extends onto the interlayer insulating film 9.

The $n^+$ cathode layer (third semiconductor region) 4 is provided on a surface layer of the rear surface of the $n^-$ semiconductor substrate so as to extend from the active region 10 to the edge termination structure portion 11. The cathode electrode (second electrode) 7 is provided on the entire rear surface of the $n^-$ semiconductor substrate, that is, the entire surface of the $n^+$ cathode layer 4. An n buffer layer (fifth semiconductor region) 5 is provided in a portion of the $n^-$ drift region 1 close to the $n^+$ cathode layer 4 so as to extend from the active region 10 to the edge termination structure portion 11. When an outer circumferential end portion of the n buffer layer 5 extends to a side surface 1a of the $n^-$ semiconductor substrate, it is possible to reduce a leakage current and to hold the breakdown voltage. The n buffer layer 5 has a function of preventing a depletion layer, which is spread from a pn junction between the $p^+$ anode layer 2 and the $n^-$ drift region 1 when the semiconductor device is turned off, from reaching the $n^+$ cathode layer 4. When the n buffer layer 5 does not have this function, it may come into contact with the $n^+$ cathode layer 4 or it may be separated from the $n^+$ cathode layer 4.

In a portion of the $n^-$ drift region 1 close to the $n^+$ cathode layer 4, a floating buried p layer (fourth semiconductor region) 6 is provided at a position that is deeper than the $n^+$ cathode layer 4 from the rear surface of the substrate. The buried p layer 6 is uniformly provided in a predetermined range of the active region 10 which comes into contact with the $n^+$ cathode layer 4. When the n buffer layer 5 comes into contact with the $n^+$ cathode layer 4, the buried p layer 6 is provided in the surface layer of the n buffer layer 5 close to the $n^+$ cathode layer 4. When the buried p layer 6 is provided, the minority carriers are injected from the cathode to the $n^-$ drift region 1 during reverse recovery to avalanche a pn diode on the cathode side, thereby forcedly increasing carrier density on the cathode side. Therefore, it is possible to perform soft recovery. The impurity concentration of the buried p layer 6 is higher than the impurity concentration of the n buffer layer 5 and is lower than the impurity concentration of the $n^+$ cathode layer 4. Specifically, the impurity concentration of the buried p layer 6 may be, for example, equal to or greater than about $1 \times 10^{16}/cm^3$ and equal to or less than about $1 \times 10^{19}/cm^3$ and preferably equal to or greater than about $1 \times 10^{17}/cm^3$ and equal to or less than about $1 \times 10^{18}/cm^3$. When the impurity concentration of the buried p layer 6 is within the above-mentioned range, it is possible to prevent an increase in leakage current.

An end portion 6a of the buried p layer 6 is located inside the side surface 1a of the $n^-$ semiconductor substrate (in the active region 10). That is, the end portion 6a of the buried p layer 6 does not reach the side surface 1a (chip side surface) of the $n^-$ semiconductor substrate. As such, when the end portion 6a of the buried p layer 6 is located inside the side surface 1a of the $n^-$ semiconductor substrate, snapback does not occur (snapback voltage≈0 V) and it is possible to prevent a jump in the current-voltage waveform (I-V waveform). The jump in the I-V waveform will be described below. In addition, the end portion 6a of the buried p layer 6 is located inside the end portion of the $n^+$ cathode layer 4. In this way, it is possible to prevent a short circuit due to the contact between the buried p layer 6 and the cathode electrode 7.

As such, since the buried p layer 6 is not provided over the entire active region 10 and the entire edge termination structure portion 11, the avalanche breakdown voltage (the voltage at which avalanche breakdown occurs) of the edge termination structure portion 11 can be greater than the avalanche breakdown voltage of the active region 10, as compared to the structure in which the buried p layer 6 is provided over the entire active region 10 and the entire edge termination structure portion 11. The reason is as follows. In the active region 10, when a reverse voltage is applied, holes are generated due to the avalanche breakdown which occurs in the pn junction between the buried p layer 6 and the $n^+$ cathode layer 4 and a hole current flows to the p+ anode layer 2 through the n− drift region 1. The hole current becomes a base current in a parasitic pnp transistor including the p+ anode layer 2, the n− drift region 1, and the buried p layer 6 and the parasitic pnp transistor operates. As a result, the avalanche breakdown voltage of the active region 10 is reduced.

Here, the avalanche breakdown voltage of the edge termination structure portion 11 can be calculated as follows. For example, a known device simulation is performed to calculate the breakdown voltage in the structure in which the edge termination structure portion is connected to the active region with a simple p-i-n (p-intrinsic-n) structure including a p+ anode layer, an n− drift region, and an n+ cathode layer. The calculated value may be used as the avalanche breakdown voltage of the edge termination structure portion 11. In this way, the avalanche breakdown voltage of the active region 10 can be less than the avalanche breakdown voltage of the edge termination structure portion 11. Therefore, an avalanche current can flow to the entire active region 10. As a result, it is possible to prevent the concentration of a current on the edge termination structure portion 11.

In addition, since the buried p layer 6 is not provided over the entire active region 10 and the entire edge termination structure portion 11, it is possible to reduce the number of electrons injected into an inactive region (for example, the edge termination structure portion 11) during reverse recovery. Therefore, it is possible to prevent the concentration of a current on an outer circumferential portion of the active region 10, that is, an end portion 3a of an anode contact due to the migration of the carriers, which are spread to the edge termination structure portion 11, to the anode electrode 3 through the anode contact during reverse recovery.

It is preferable that the end portion 6a of the buried p layer 6 be disposed at a position that is a first length t1 inside from the end portion 3a of the anode contact (a junction between the p+ anode layer 2 and the anode electrode 3) of the active region 10 (a position close to a central portion of an FWD cell). The FWD cell is a unit region including the p+ anode layer 2, the n+ cathode layer 4, the n buffer layer 5, and the buried p layer 6. The first length t1 from the end portion 3a of the anode contact to the end portion 6a of the buried p layer 6 which is disposed inside the end portion 3a may be equal to or less than a diffusion length $L_h$ of the minority carrier (t1≤$L_h$). The reason is as follows. When the semiconductor device is in an on state, the buried p layer 6 enables the minority carriers, which are injected from the cathode to the n− drift region 1, to reach the end portion 3a of the anode contact. Therefore, it is possible to prevent a reduction in the effect obtained by the buried p layer 6.

The diffusion length $L_h$ of the minority carrier is represented by the following Expression (1). In the following Expression (1), the lifetime of the minority carrier is $\tau_h$ and a diffusion coefficient of the minority carrier is $D_h$. The diffusion coefficient $D_h$ of the minority carrier is represented by the following Expression (2). In the following Expression (2), an elementary charge is q, a Boltzmann constant is K, an absolute temperature is T, and the mobility of the minority carrier is $\mu_h$. KT/q is a thermal voltage at an absolute temperature T of 300 K.

[Expression 1]

$$L_h = \sqrt{D_h \cdot \tau_h} \quad (1)$$

[Expression 2]

$$D_h = \frac{KT}{q}\mu_h \quad (2)$$

Specifically, the diffusion coefficient $D_h$ of the minority carrier is $1.56\times10^{-3}$ cm$^2$/s, the mobility $\mu_h$ of the minority carrier is 0.06 cm$^2$/Vs, and KT/q is $2.60\times10^2$ eV. Therefore, when the lifetime $\tau_h$ of the minority carrier in the n− drift region 1 is 10 μs (that is, when the minority carrier is a non-killer), the diffusion length $L_h$ of the minority carrier is 124.90 μm from the above-mentioned Expressions (1) and (2). When the lifetime $\tau_h$ of the minority carrier in the n− drift region 1 is 3 μs, the diffusion length $L_h$ of the minority carrier is 68.41 μm. When lifetime $\tau_h$ of the minority carrier in the n− drift region 1 is 0.1 μs, the diffusion length $L_h$ of the minority carrier is 12.49 μm.

Figure 3:
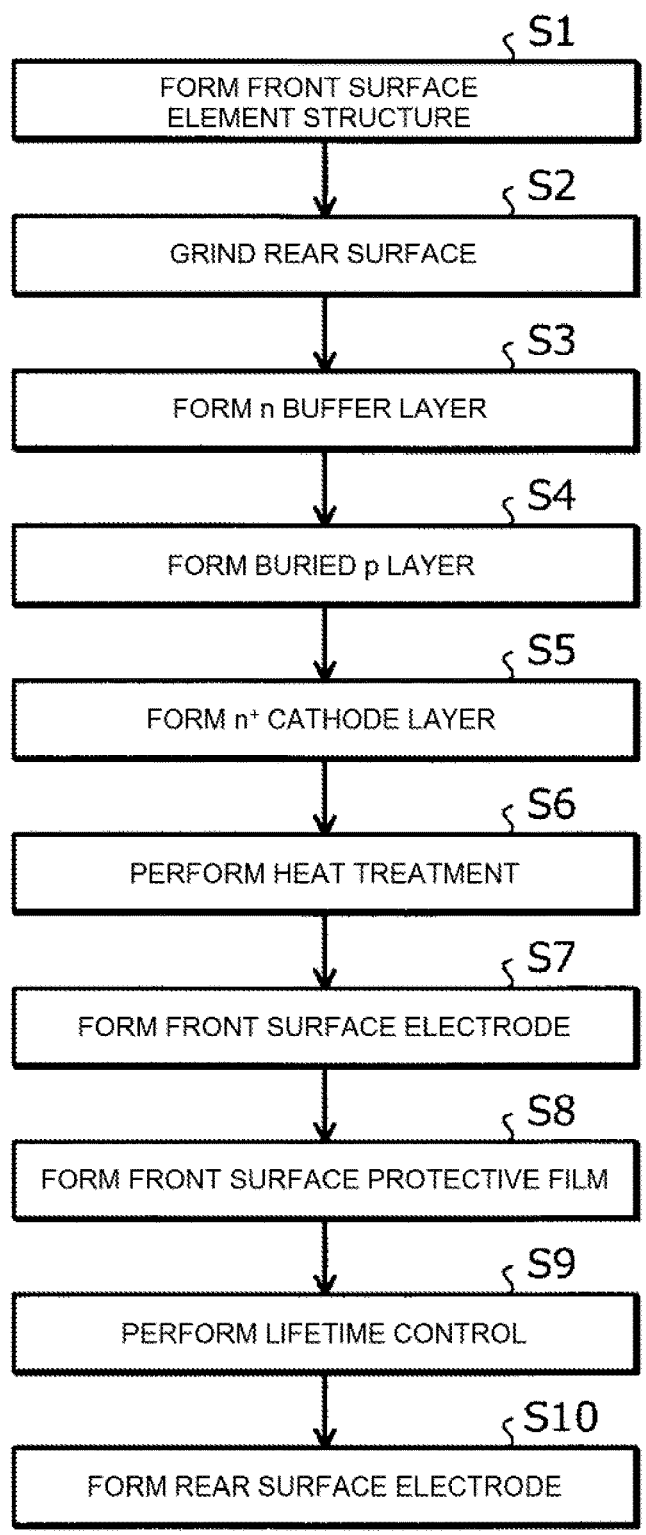
FIG. 3 is a flowchart illustrating the outline of a method for manufacturing the semiconductor device according to Embodiment 1.

Next, a method for manufacturing the semiconductor device according to Embodiment 1 will be described. FIG. 3 is a flowchart illustrating the outline of the method for manufacturing the semiconductor device according to Embodiment 1. First, a front surface element structure, such as the p+ anode layer 2 or the FLR 8, is formed on the front surface side of the n− semiconductor substrate which will be the n− drift region 1 (Step S1). Specifically, a resist mask in which a region for forming the p+ anode layer 2 and the FLR 8 is opened is formed on the front surface of the n− semiconductor substrate. Then, p-type impurity ions, such as boron (B) ions, are implanted into the front surface of the n− semiconductor substrate, using the resist mask as a mask.

Then, after the resist mask is removed, the implanted p-type impurities are thermally diffused to form the p+ anode layer 2 and the FLR 8. Then, the interlayer insulating film 9 is formed on the front surface of the n− semiconductor substrate. Then, a portion of the interlayer insulating film 9 corresponding to the active region 10 is removed to form an anode contact hole through which the p+ anode layer 2 is exposed. In this way, the front surface element structure is formed on the front surface side of the n− semiconductor substrate. Then, the rear surface of the n− semiconductor substrate is ground to reduce the thickness of the n− semiconductor substrate (Step S2).

Then, n-type impurity ions, such as selenium (Se) ions, are implanted into the entire ground rear surface of the n− semiconductor substrate to form the n buffer layer 5 (Step S3). Then, a resist mask in which a region for forming the buried p layer 6 is opened is formed on the rear surface of the n− semiconductor substrate. For example, the resist mask covers the edge termination structure portion 11 and a portion of the active region 10 which is the first length t1 inside from the end portion of the anode contact hole. Then, p-type impurity ions, such as boron ions, are implanted into the rear surface of the n− semiconductor substrate, using the resist mask as a mask, to form the buried p layer 6 in the active region 10 (Step S4).

It is preferable that, in the ion implantation of Step S4, boron concentration in the rear surface of the substrate be reduced such that the surface layer of the rear surface of the n− semiconductor substrate becomes an n-type region. Specifically, the p-type impurity concentration of the rear surface of the n− semiconductor substrate by ion implantation in Step S5, which will be described below, may be, for example, equal to or less than $1\times10^{15}$/cm$^3$. The reason is that, when the n+ cathode layer 4 formed in Step S5 does not have a uniform thickness, it is possible to prevent a short circuit between the buried p layer 6 and the cathode electrode 7 in a thin portion of the n⁺ cathode layer 4. That is, it is preferable that the surface layer of the rear surface of the n⁻ semiconductor substrate after the ion implantation in Step S5 have an impurity concentration distribution close to that of the n-type region.

Then, after the resist mask is removed, n-type impurity ions, such as phosphorus (P) ions, are implanted into the entire rear surface of the n⁻ semiconductor substrate to form the n⁺ cathode layer 4 at a position deeper than the buried p layer 6 (Step S5). Then, the impurities implanted in the ion implantation process of Steps S3 to S5 are collectively thermally diffused by a heat treatment using, for example, furnace annealing (Step S6). Since the impurities implanted in the ion implantation process of Steps S3 to S5 are collectively thermally diffused, it is possible to reduce the number of processes and to reduce costs. Whenever the ion implantation process of Steps S3 to S5 is performed, it is preferable to thermally diffuse the implanted impurities. In addition, the order of the ion implantation process of Steps S3 to S5 may be changed in various ways.

Then, the anode electrode (front surface electrode) 3 is formed on the front surface of the n⁻ semiconductor substrate so as to be buried in the anode contact hole and is patterned in a predetermined shape (Step S7). Then, a passivation film (not illustrated) is formed on the front surface of the n⁻ semiconductor substrate and is patterned in a predetermined shape (Step S8). Then, for example, electron beams are radiated to the n⁻ semiconductor substrate to control the lifetime of the carriers in the n⁻ drift region 1 (Step S9). Then, the cathode electrode 7 is formed on the rear surface of the n⁻ semiconductor substrate (Step S10). In this way, the FWD illustrated in FIG. 1 is completed.

Figure 4:
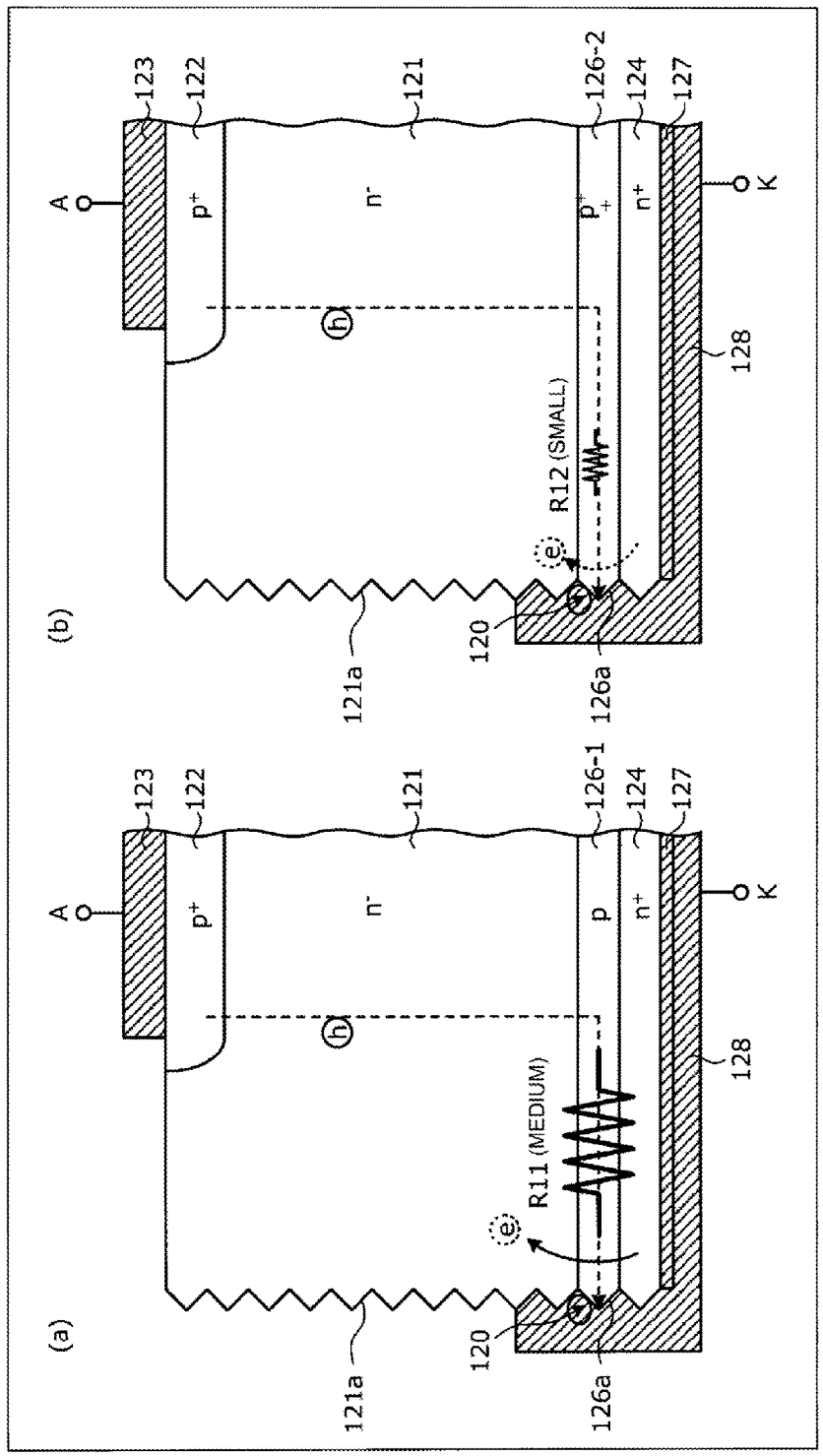
FIG. 4 is a diagram illustrating the operation of a semiconductor device according to a comparative example when a forward voltage is applied.
Figure 5:
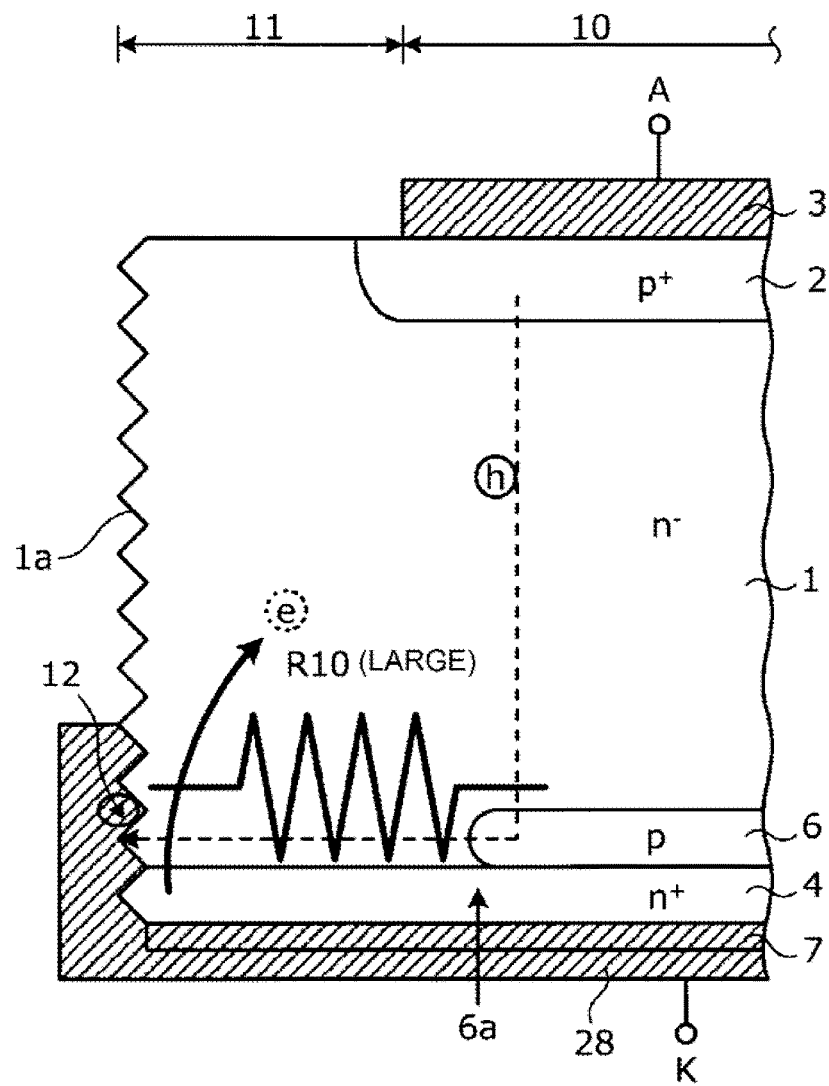
FIG. 5 is a diagram illustrating the operation of the semiconductor device according to Embodiment 1 when the forward voltage is applied.

Next, the operation of the semiconductor device according to the invention will be described. FIG. 4 is a diagram illustrating the operation of a semiconductor device according to a comparative example when a forward voltage is applied. FIG. 5 is a diagram illustrating the operation of the semiconductor device according to Embodiment 1 when the forward voltage is applied. FIG. 4 illustrates an FWD (hereinafter, referred to as a comparative example) with a structure in which an end portion 126a of a buried p layer 126 reaches a side surface 121a of an n⁻ semiconductor substrate. FIG. 5 illustrates the FWD according to Embodiment 1 illustrated in FIG. 1. In FIG. 5, the edge termination structure portion 11 is shortened and the n buffer layer 5 is not illustrated, in order to clearly describe the operation of the carriers.

In the comparative example illustrated in FIG. 4, since the side surface 121a of the n⁻ semiconductor substrate is roughened due to unevenness which occurs during dicing, a leakage current is likely to flow from the side surface 121a of the n⁻ semiconductor substrate. Therefore, when the forward voltage is applied, holes which are injected from a p⁺ anode layer 122 to an n⁻ drift region 121 move to a cathode electrode 127 on the side surface 121a of the n⁻ semiconductor substrate through a buried p layer 126-1 (a path indicated by a dotted arrow) and do not reach an n⁺ cathode layer 124. That is, this is substantially the same as a state in which a short circuit occurs between the buried p layer 126-1 and the cathode electrode 127 in the side surface 121a of the n⁻ semiconductor substrate. Therefore, no electron is injected from the n⁺ cathode layer 124 to the n⁻ drift region 121 and the FWD is not turned on.

In addition, in the comparative example illustrated in FIG. 4, the following problems are likely to arise. FIG. 4(a) illustrates a first comparative example in which the rear surface of a chip is soldered to, for example, a direct copper bond (DCB) substrate. As illustrated in FIG. 4(a), in the first comparative example, a solder layer 128 on the rear surface of the chip protrudes from the side surface of the chip (the side surface 121a of the n⁻ semiconductor substrate) and the end portion 126a of the buried p layer 126-1 is short-circuited to the cathode electrode 127 by the solder layer 128 (a portion represented by reference numeral 120). As such, the state in which the solder layer 128 reaches the side surface 121a of the n⁻ semiconductor substrate (that is, the state in which the short circuit occurs between the cathode electrode 127 and the buried p layer 126-1) indicates, for example, a state in which, when the n⁻ semiconductor substrate is incorporated into a power module and is soldered to the DCB substrate, the solder layer 128 which is melted in the rear surface of the n⁻ semiconductor substrate flows from the rear surface to the side surface 121a of the n⁻ semiconductor substrate and comes into contact with the side surface 121a. The depth of a junction interface between the n⁺ cathode layer 124 and the buried p layer 126-1 in the rear surface of the n⁻ semiconductor substrate is about 1 μm to 3 μm from the rear surface of the n⁻ semiconductor substrate. Therefore, when the solder layer 128 with a thickness of 300 μm or more protrudes from the side surface 121a of the n⁻ semiconductor substrate, a short circuit is likely to occur between the buried p layer 126-1 and the cathode electrode 127 in the side surface 121a of the n⁻ semiconductor substrate.

Therefore, no electron is injected from the cathode to the n⁻ drift region 121 and a voltage drop in a short pass does not become a built-in voltage (0.7 V). As a result, the FWD according to the first comparative example is not turned on. Thereafter, when a given amount of current flows, the buried p layer 126-1 and the n⁺ cathode layer 124 are biased forward by resistance R11 in the short pass of the buried p layer 126-1. Then, electrons are injected from the cathode to the n⁻ drift region 121 and the voltage drop in the short pass is greater than the built-in voltage. As a result, latch-up occurs in a portion close to the active region and the FWD is turned on.

Figure 30:
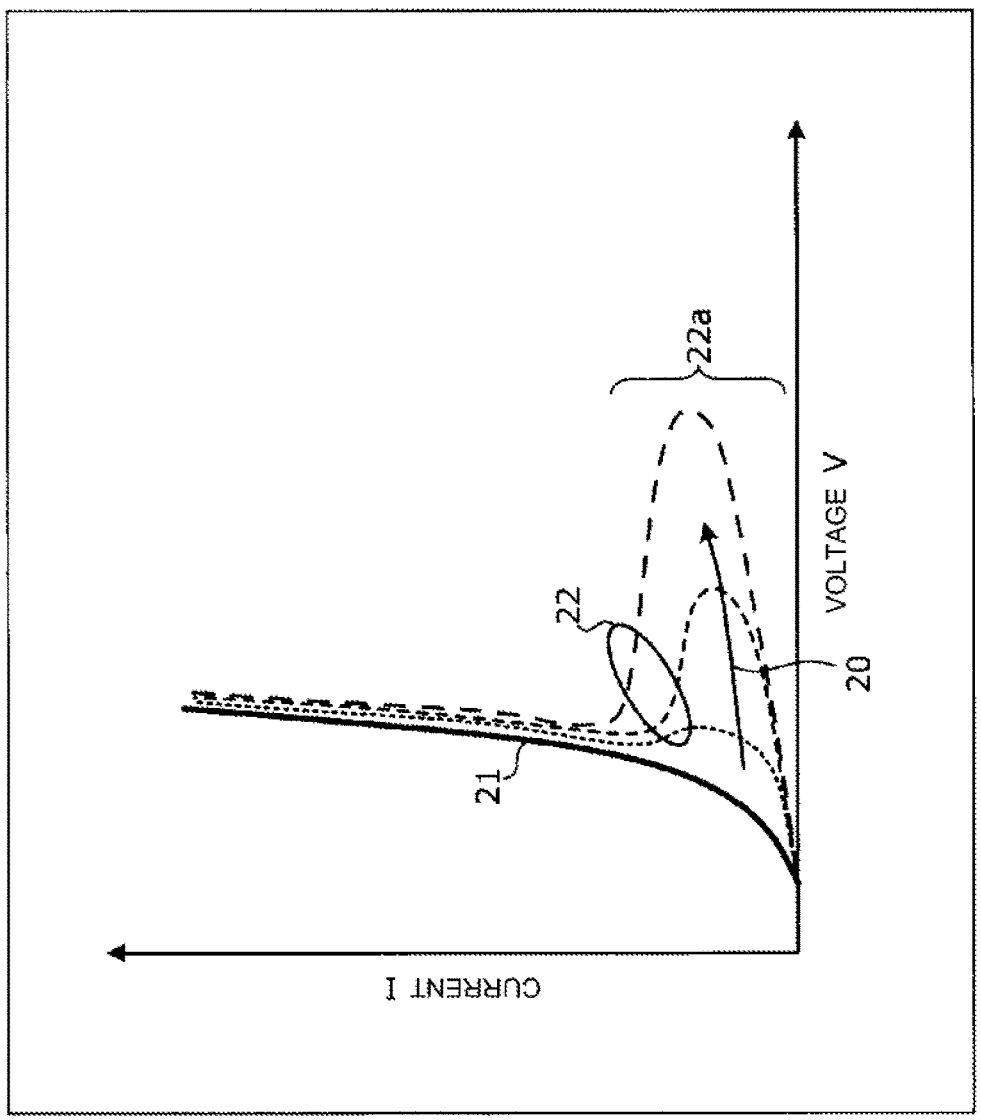
FIG. 30 is a characteristic diagram illustrating a current-voltage waveform when a forward bias is applied in a diode.

As such, the first comparative example has undesirable characteristics that, after the forward voltage is applied, there is a period for which the FWD does not operate (a jump in the I-V waveform) and the FWD starts to operate after the period has elapsed. FIG. 30 illustrates an I-V waveform when a diode is biased forward. FIG. 30 is a characteristic diagram illustrating the current-voltage waveform when the diode is biased forward. As represented by a thick solid line, in a general waveform (hereinafter, referred to as a normal waveform) 21, a current increases with a forward voltage drop. However, when the latch-up is less likely to occur, a high forward voltage drop occurs and little current flows, as represented by a dotted line (a waveform represented by reference numeral 22). Therefore, at the time when the voltage drop between the buried p layer and the n cathode layer is equal to or greater than the built-in voltage due to the passage of holes, a current flows at once and the forward voltage drop of the diode is reduced. A region which serves as negative resistance is snapback, that is, a jump 22a in the I-V waveform.

As in a second comparative example illustrated in FIG. 4(b), as the impurity concentration of a buried p⁺⁺ layer 126-2 increases, the resistance R12 of the short pass in the buried p⁺⁺ layer 126-2 decreases and a voltage (snapback voltage) which causes the snapback increases. Therefore, the jump in the I-V waveform increases. In FIG. 30, the magnitude of the impurity concentration of the buried p layer is represented by the direction of an arrow 20. The jump 22a increases as the impurity concentration of the p layer increases (an I-V waveform 22 indicated by a dashed line). That is, among three I-V waveforms 22 in which the jump 22a occurs, the I-V waveform 22 with the smallest jump 22a which is represented by the thinnest dotted line corresponds to the first comparative example illustrated in FIG. 4(a) and the other I-V waveforms 22 correspond to the second comparative example illustrated in FIG. 4(b). In FIGS. 4(a) and 4(b), reference numeral 122 indicates a p$^+$ anode layer and reference numeral 123 indicates an anode electrode.

In contrast, as illustrated in FIG. 5, in the invention, the end portion 6a of the buried p layer 6 does not reach the side surface 1a of the n$^-$ semiconductor substrate and the buried p layer 6 is in a floating state. In addition, resistance R10 between the end portion 6a of the buried p layer 6 and the side surface 1a of the n$^-$ semiconductor substrate is determined by the impurity concentration of the n$^-$ drift region 1 with high resistance and is more than the resistance R11 and the resistance R12 of the first and second comparative examples which are determined by the impurity concentration of the buried p layers 126-1 and 126-2. Therefore, the holes which are injected from the p$^+$ anode layer 2 to the buried p layer 6 through the n$^-$ drift region 1 when the forward voltage is applied is less likely to move from the end portion 6a of the buried p layer 6 to the cathode electrode 7 on the side surface 1a of the n$^-$ semiconductor substrate (a portion represented by reference numeral 12) and moves to the n$^+$ cathode layer 4. Then, electrons are injected from the n$^+$ cathode layer 4 to the n$^-$ drift region 1. Therefore, in the semiconductor device according to the invention, a jump in the I-V waveform does not occur. As a result, the semiconductor device according to the invention has the normal waveform 21 illustrated in FIG. 30 and operates substantially similarly to the general FWD without the buried p layer 6. Reference numeral 28 indicates a solder layer when the rear surface of the chip is soldered to, for example, the DCB substrate.

As described above, according to Embodiment 1, since the buried p layer is uniformly provided, a uniform voltage drop (avalanche breakdown) can occur in the rear surface of the substrate during reverse recovery and it is possible to prevent a jump in the I-V waveform. Therefore, it is possible to perform soft recovery and to avoid problems due to EMI noise. In addition, according to Embodiment 1, since the buried p layer is uniformly provided, alignment accuracy in the rear surface of the substrate does not need to be higher than that in the structure according to the related art in which a plurality of buried p layers are provided at predetermined intervals. Therefore, it is possible to form the buried p layer with high dimensional accuracy with a small number of processes. In addition, special equipment for improving alignment accuracy is not needed. Therefore, it is possible to provide a semiconductor device at low costs.

According to Embodiment 1, since the end portion of the buried p layer is located inside the end portion of the anode contact, the breakdown voltage of the active region is less than the breakdown voltage of an inactive region. Therefore, it is possible to prevent the concentration of the electric field on the end portion of the active region during reverse recovery. The reason is as follows. When a high voltage is applied to the FWD during reverse recovery, the pn junction (hereinafter, referred to as a pn junction J1) between the buried p layer and the n cathode layer on the rear surface of the substrate is reversely biased. The impurity concentration of the two layers is higher than the impurity concentration of the semiconductor substrate by two digits or more. Therefore, even when a voltage of 100 V or less is applied to the pn junction J1, avalanche breakdown is easy to occur. When the pn junction J1 causes the avalanche breakdown, holes are injected from the pn junction J1 in which the buried p layer is formed. The holes drift to the p$^+$ anode layer in the depletion layer. Then, electric field intensity is increased by the holes even in the vicinity of a pn junction (hereinafter, referred to as a pn junction J2) between the p$^+$ anode layer and the n drift layer. That is, the gradient of electric field intensity increases in the vicinity of the pn junction J2 due to an excessive increase in positive charge caused by the holes according to the Poisson's equation. That is, the effective impurity concentration of the semiconductor substrate increases. When the gradient of the electric field intensity increases, the maximum electric field intensity of the pn junction J2 significantly increases and reaches critical electric field intensity. As a result, avalanche breakdown occurs. In other words, a dynamic breakdown voltage is reduced in the active region. Since the increase in the maximum electric field intensity of the pn junction J2 occurs only in the active region in which the buried p layer is formed, the dynamic breakdown voltage is not reduced in the inactive region. This is the reason why the dynamic breakdown voltage is reduced in the active region and the inactive region. Since the dynamic breakdown voltage is reduced only in the region in which the buried p layer is formed, a reverse recovery current does not flow to the end portion of the p$^+$ anode layer when the buried p layer is formed inside the p$^+$ anode layer in the chip. Therefore, the concentration of a current on the end portion of the p$^+$ anode layer is prevented and it is possible to prevent element breakdown due to the maximum voltage applied to during reverse recovery or a current change rate di/dt.

Embodiment 2

Figure 6:
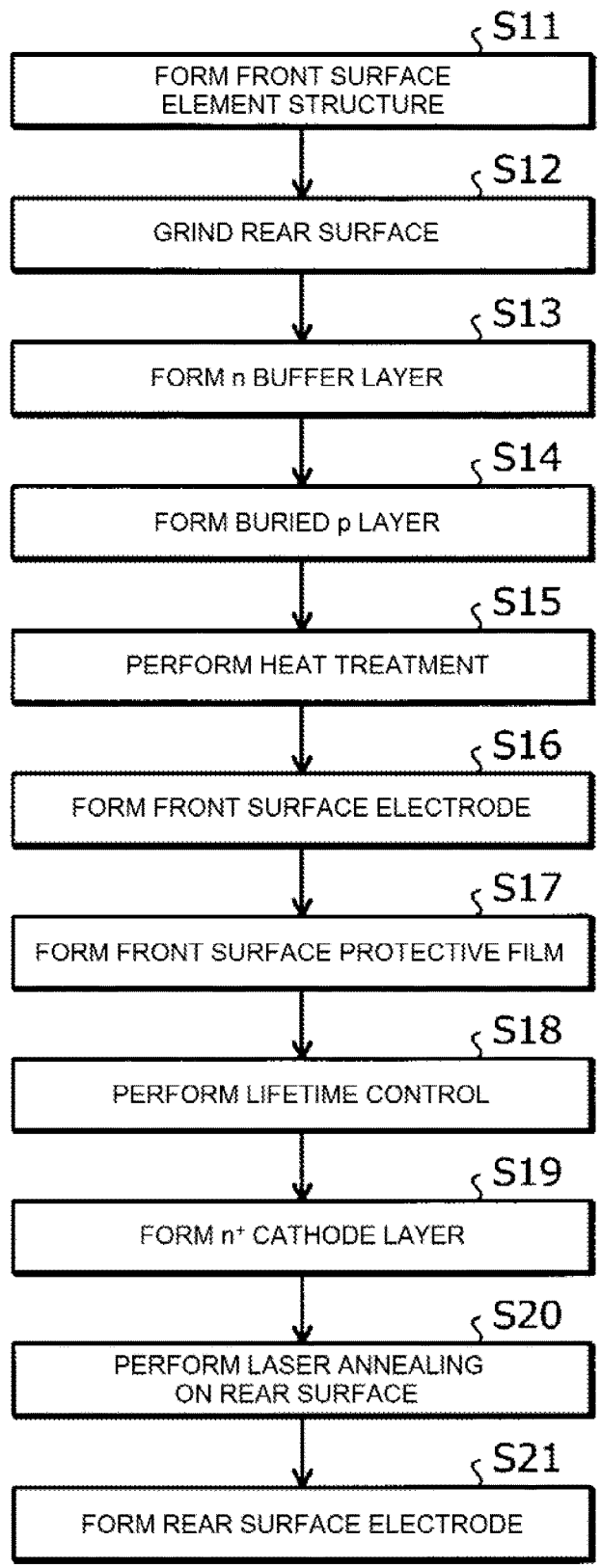
FIG. 6 is a flowchart illustrating the outline of a semiconductor device manufacturing method according to Embodiment 2.

Next, a semiconductor device manufacturing method according to Embodiment 2 will be described. FIG. 6 is a flowchart illustrating the outline of the semiconductor device manufacturing method according to Embodiment 2. The semiconductor device manufacturing method according to Embodiment 2 differs from the semiconductor device manufacturing method according to Embodiment 1 in that, after electron beams are radiated to control the lifetime, an n$^+$ cathode layer 4 is formed and laser annealing is performed to activate the n$^+$ cathode layer 4.

Specifically, first, similarly to Embodiment 1, a process from the formation of a front surface element structure to the formation of a buried p layer 6 is performed (Steps S11 to S14). Then, after a resist mask used to form the buried p layer 6 is removed, impurities which are implanted by an ion implantation process for forming an n buffer layer 5 and an ion implantation process for forming the buried p layer 6 are thermally diffused by a heat treatment using, for example, furnace annealing (Step S15). Then, similarly to Embodiment 1, a process from the formation of an anode electrode 3 to the control of the lifetime is performed (Steps S16 to S18). Then, the n$^+$ cathode layer 4 is formed on the entire rear surface of the n$^-$ semiconductor substrate (Step S19). A method for forming the n$^+$ cathode layer 4 is the same as that in Embodiment 1. Then, laser annealing is performed on the rear surface of the n$^-$ semiconductor substrate to activate the n$^+$ cathode layer 4 (Step S20). Then, a cathode electrode 7 is formed on the rear surface of the n$^-$ semiconductor substrate (Step S21). In this way, the FWD illustrated in FIG. 1 is completed.

As described above, according to Embodiment 2, it is possible to obtain the same effect as that in Embodiment 1.

Embodiment 3

Figure 7:
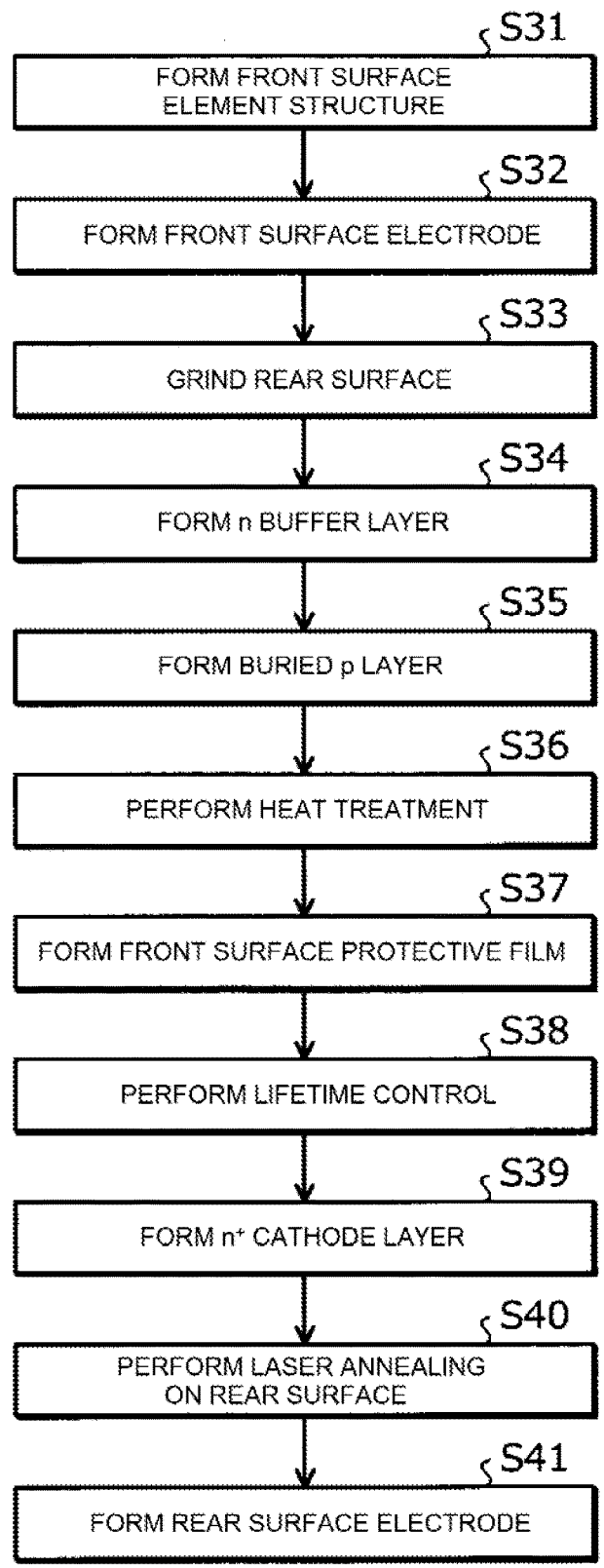
FIG. 7 is a flowchart illustrating the outline of a semiconductor device manufacturing method according to Embodiment 3.

Next, a semiconductor device manufacturing method according to Embodiment 3 will be described. FIG. 7 is a flowchart illustrating the outline of the semiconductor device manufacturing method according to Embodiment 3. The semiconductor device manufacturing method according to Embodiment 3 differs from the semiconductor device manufacturing method according to Embodiment 2 in that an anode electrode 3 is formed on the front surface of an $n^-$ semiconductor substrate before the rear surface of the $n^-$ semiconductor substrate is ground to reduce the thickness of the $n^-$ semiconductor substrate.

Specifically, first, a front surface element structure is formed on the front surface of the $n^-$ semiconductor substrate which will be an $n^-$ drift region 1 (Step S31) and the anode electrode 3 is formed (Step S32). A method for forming the front surface element structure and a method for forming the anode electrode 3 are the same as those in Embodiment 1. Then, similarly to Embodiment 2, a process from the grinding of the rear surface of the $n^-$ semiconductor substrate to a heat treatment is performed (Steps S33 to S36). Then, similarly to Embodiment 2, a process from the formation of a passivation film to the formation of a cathode electrode 7 is performed (Steps S37 to S41). In this way, the FWD illustrated in FIG. 1 is completed.

As described above, according to Embodiment 3, it is possible to obtain the same effect as that in Embodiments 1 and 2.

Embodiment 4

Figure 8:
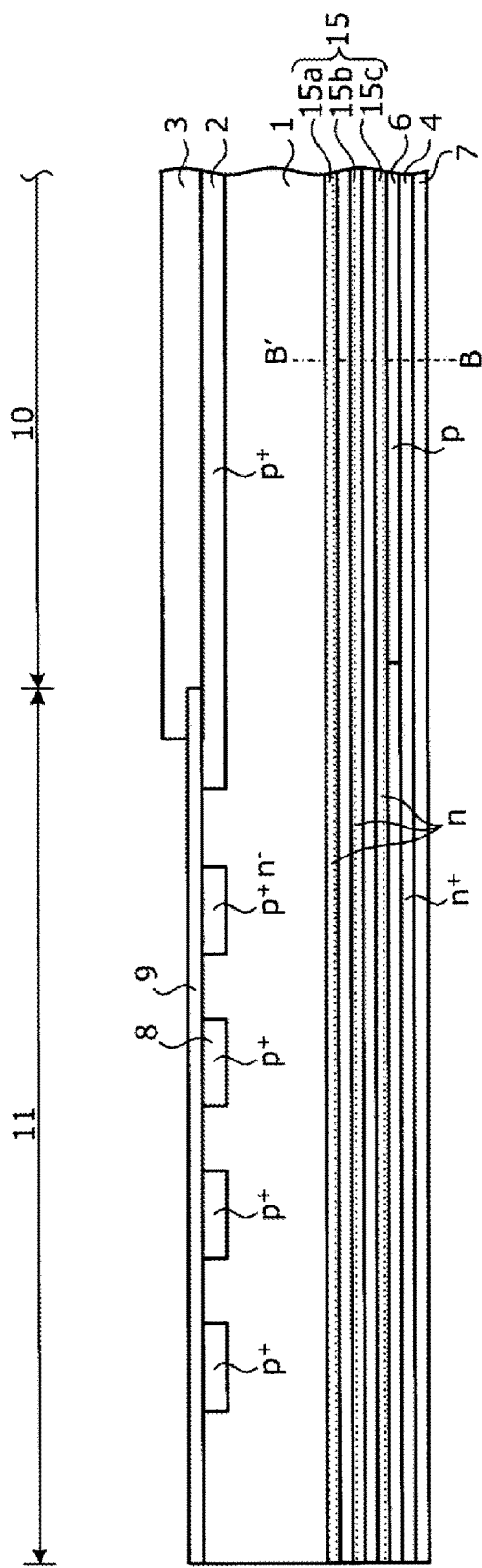
FIG. 8 is a cross-sectional view illustrating the structure of a semiconductor device according to Embodiment 4.
Figure 9:
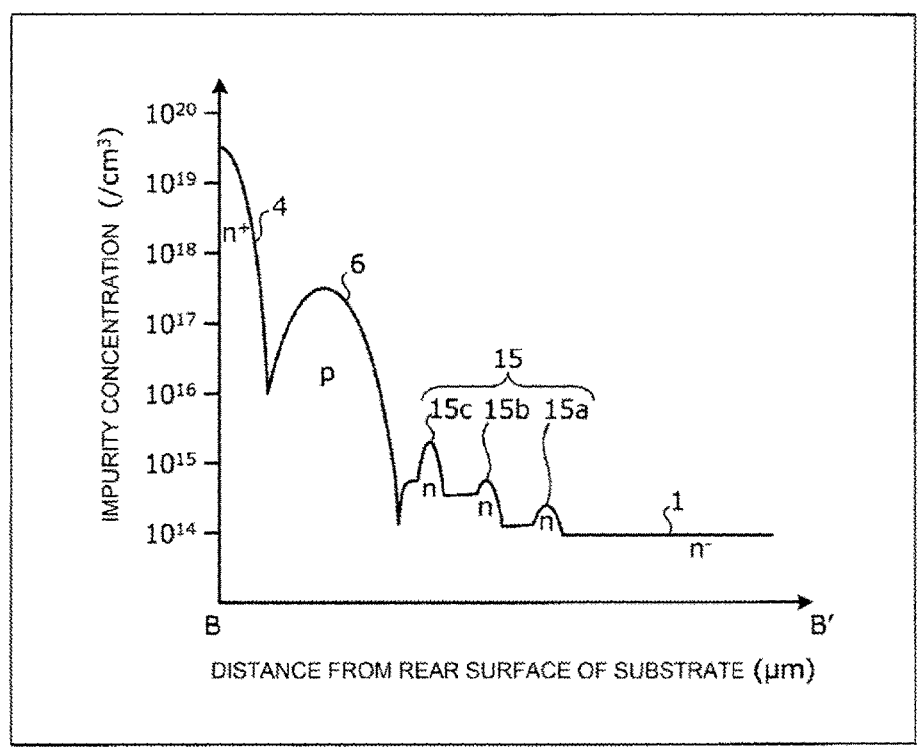
FIG. 9 is a characteristic diagram illustrating an impurity concentration distribution along the cutting line B-B' of FIG. 8.

Next, the structure of a semiconductor device according to Embodiment 4 will be described. FIG. 8 is a cross-sectional view illustrating the structure of the semiconductor device according to Embodiment 4. FIG. 9 is a characteristic diagram illustrating an impurity concentration distribution along a cutting line B-B' of FIG. 8. The semiconductor device according to Embodiment 4 differs from the semiconductor device according to Embodiment 1 in that a plurality of n buffer layer 15 are formed at different depths from the rear surface of a substrate by multi-stage irradiation with protons from the rear surface of the substrate. For example, when the n buffer layers 15 are formed by three-stage irradiation with protons, an n buffer layer 15a is arranged at the deepest position from the rear surface of an $n^-$ semiconductor substrate which will be an $n^-$ drift region 1.

In addition, an n buffer layer 15b is arranged at a position that is shallower than the n buffer layer 15a from the rear surface of the $n^-$ semiconductor substrate so as to be separated from the n buffer layer 15a. Then, an n buffer layer 15c is arranged at a position that is shallower than the n buffer layer 15b from the rear surface of the $n^-$ semiconductor substrate so as to be separated from the n buffer layer 15b. That is, the $n^-$ drift region 1 is arranged between the n buffer layers 15a to 15c. The n buffer layer 15c is arranged at a position that is deeper than the $n^+$ cathode layer 4 and a buried p layer 6 is provided between the n buffer layer 15c and an $n^+$ cathode layer 4 in an active region 10. The n buffer layer 15c may come into contact with the buried p layer 6 or it may be separated from the buried p layer 6.

Figure 10:
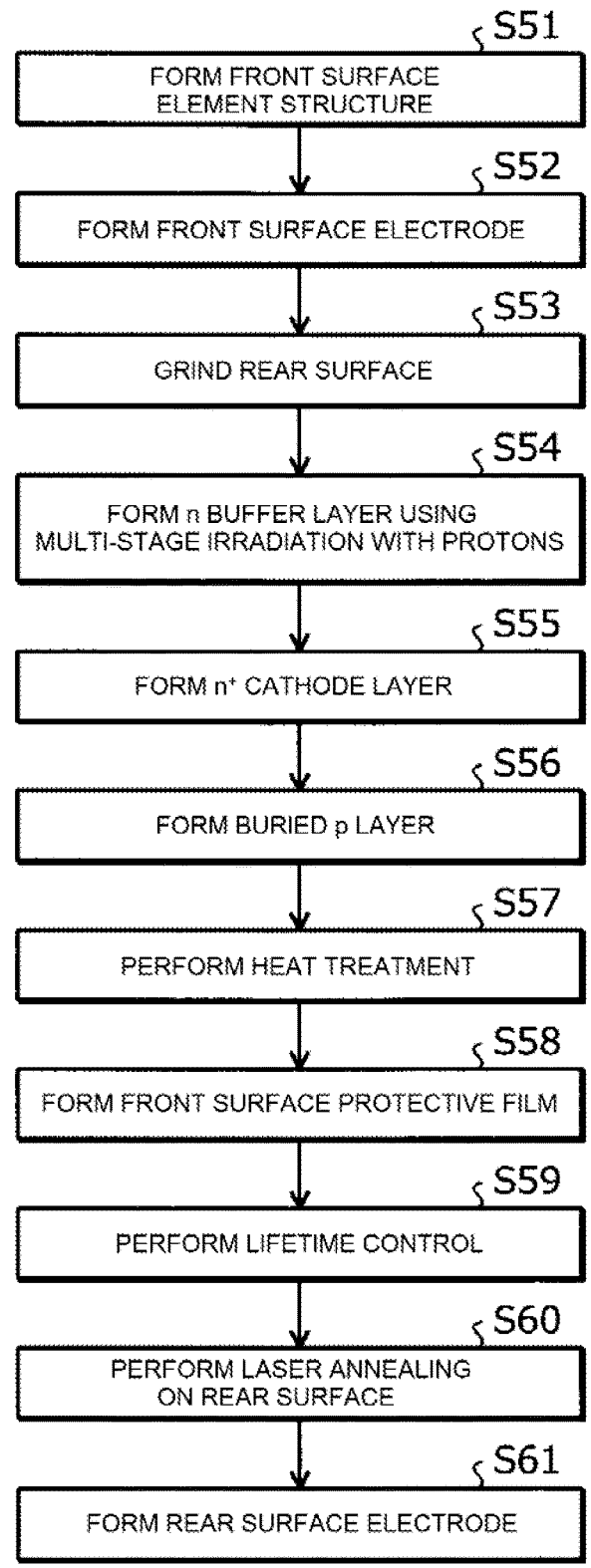
FIG. 10 is a flowchart illustrating the outline of a method for manufacturing the semiconductor device according to Embodiment 4.

Next, a method for manufacturing the semiconductor device according to Embodiment 4 will be described. FIG. 10 is a flowchart illustrating the outline of the semiconductor device manufacturing method according to Embodiment 4. First, a front surface element structure is formed on the front surface side of the $n^-$ semiconductor substrate which will be the $n^-$ drift region 1 (Step S51) and the anode electrode 3 is formed (Step S52). A method for forming the front surface element structure and a method for manufacturing the anode electrode 3 are the same as those in Embodiment 1. Then, the rear surface of the $n^-$ semiconductor substrate is ground to reduce the thickness of the $n^-$ semiconductor substrate (Step S53).

Then, for example, three proton irradiation processes are performed in different ranges from the rear surface of the $n^-$ semiconductor substrate to form the n buffer layers 15a to 15c at different depths from the rear surface of the substrate (Step S54). Then, n-type impurity ions, such as phosphorus ions, are implanted into the entire rear surface of the $n^-$ semiconductor substrate to form the $n^+$ cathode layer 4 (Step S55). Then, the buried p layer 6 is formed at the position that is deeper than the $n^+$ cathode layer 4 and is shallower than the n buffer layer 15c from the rear surface of the substrate (Step S56). A method for forming the $n^+$ cathode layer 4 and a method for forming the buried p layer 6 are the same as those in Embodiment 1.

Then, a heat treatment is performed to collectively activate and thermally diffuse the protons and the impurities which are implanted in Steps S54 to S56 (Step S57). Then, a passivation film is formed on the front surface of the $n^-$ semiconductor substrate (Step S58) and the lifetime of the carriers in the $n^-$ drift region 1 is controlled (Step S59). A method for forming the passivation film and a method for controlling the lifetime are the same as those in Embodiment 1. Then, laser annealing is performed on the rear surface of the $n^-$ semiconductor substrate to activate the $n^+$ cathode layer 4 (Step S60). Then, a cathode electrode 7 is formed on the rear surface of the $n^-$ semiconductor substrate (Step S61). In this way, the FWD illustrated in FIG. 8 is completed.

As described above, according to Embodiment 4, it is possible to obtain the same effect as that in Embodiments 1 to 3.

Embodiment 5

Figure 11:
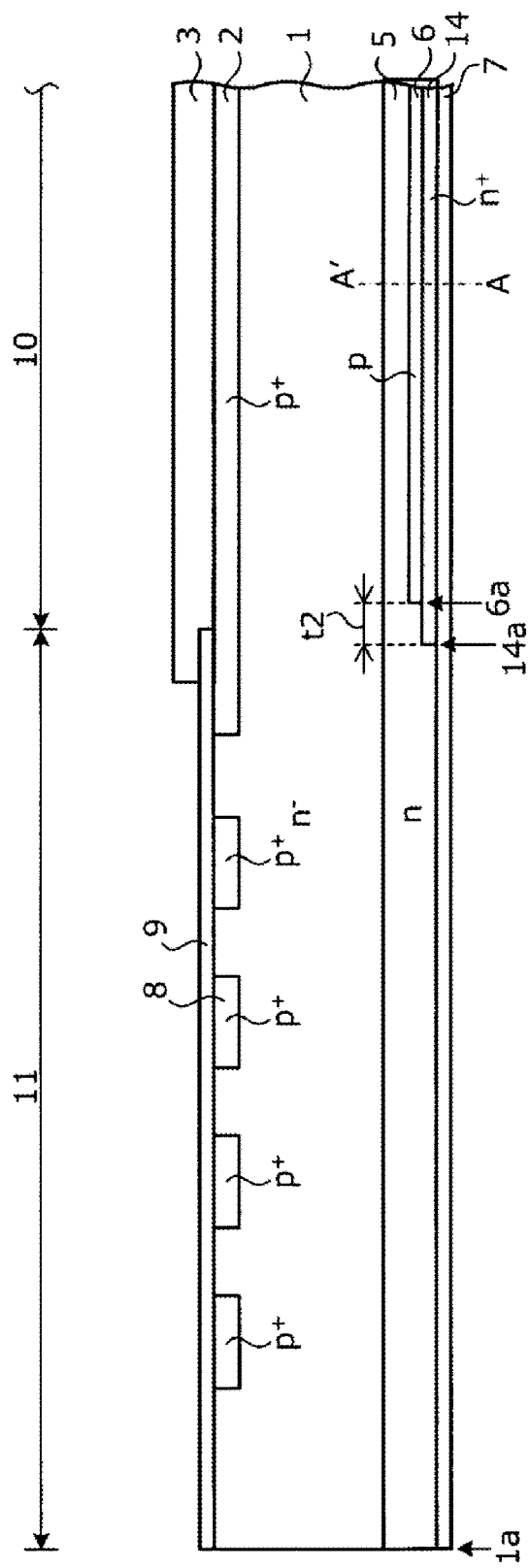
FIG. 11 is a cross-sectional view illustrating the structure of a semiconductor device according to Embodiment 5.

Next, the structure of a semiconductor device according to Embodiment 5 will be described. FIG. 11 is a cross-sectional view illustrating the structure of the semiconductor device according to Embodiment 5. An impurity concentration distribution along a cutting line A-A' of FIG. 11 is the same as the impurity concentration distribution illustrated in FIG. 2. The semiconductor device according to Embodiment 5 differs from the semiconductor device according to Embodiment 1 is that an end portion 14a of an $n^+$ cathode layer 14 is located inside a side surface 1a of an $n^-$ semiconductor substrate (on the side close to the center of an FWD cell). That is, in Embodiment 5, the $n^+$ cathode layer 14 is not provided on the rear surface side of the substrate in an edge termination structure portion 11 and a Schottky junction between a cathode electrode 7 and an n buffer layer 5 is formed on the rear surface side of the substrate.

An end portion 6a of a buried p layer 6 is preferably provided at a position that is a second length t2 inside from the end portion 14a of the $n^+$ cathode layer 14. In this case, it is possible to prevent the buried p layer 6 from coming into contact with the cathode electrode 7 on the rear surface of the substrate due to an alignment error. Preferably, the second length t2 has allowance for alignment accuracy (for example, allowance that is about two times the alignment accuracy). For example, the second length t2 is preferably equal to or greater than about 1 µm and equal to or less than about 10 µm. Specifically, the second length t2 from the end portion 6a of the buried p layer 6 to the end portion 14a of the n+ cathode layer 14 is preferably, for example, equal to or greater than about 1 µm and equal to or less than about 10 µm.

In a method for manufacturing the semiconductor device according to Embodiment 5, a resist mask in which a region for forming the n+ cathode layer 14 is opened may be formed on the rear surface of the n− semiconductor substrate and the n+ cathode layer 14 may be formed in an active region 10, using the resist mask as a mask in Step S5 which is the same as that in the semiconductor device manufacturing method according to Embodiment 1. The semiconductor device manufacturing method according to Embodiment 5 is the same as the semiconductor device manufacturing method according to Embodiment 1 except for the step of forming the n+ cathode layer 14.

As described above, according to Embodiment 5, it is possible to obtain the same effect as that in Embodiments 1 to 4. In addition, according to Embodiment 5, the n+ cathode layer is not provided in the edge termination structure portion and the Schottky junction between the n+ cathode layer and the cathode electrode is formed in the edge termination structure portion. Therefore, when the forward voltage is applied, the injection of the carriers (electrons) from the cathode in the edge termination structure portion is further suppressed. Therefore, it is possible to prevent the carriers from being stored in the edge termination structure portion and thus to prevent the concentration of a current on the end portion of the anode contact during reverse recovery. As a result, it is possible to improve the breakdown voltage during reverse recovery.

Embodiment 6

Figure 12:
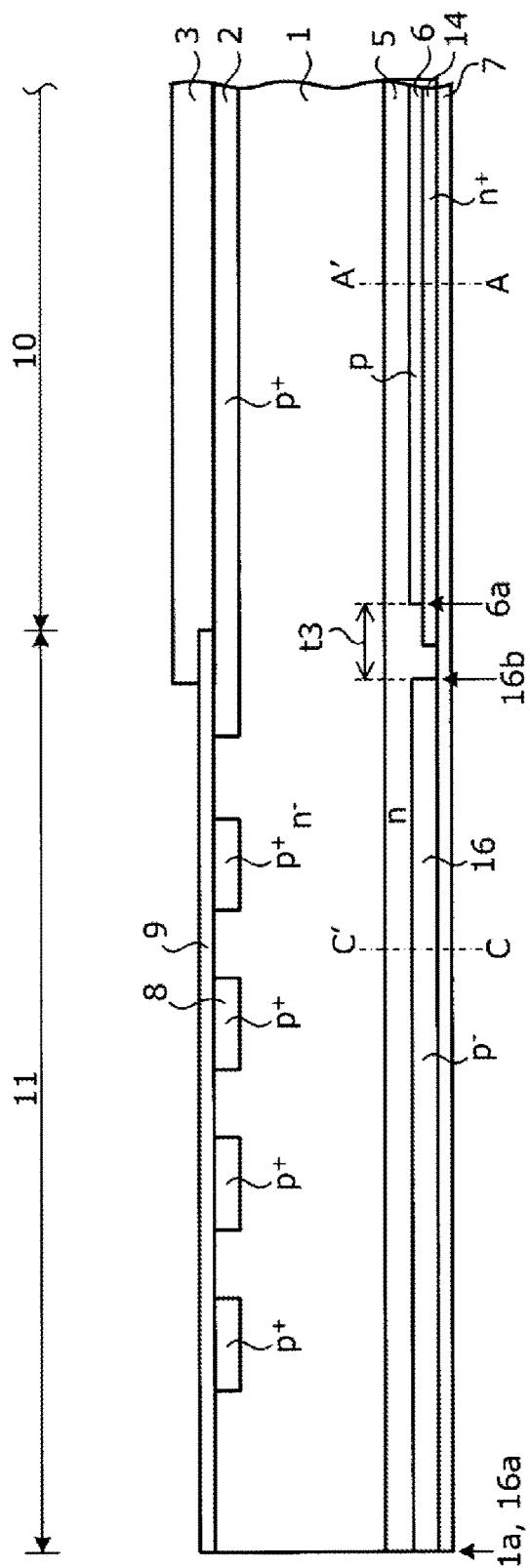
FIG. 12 is a cross-sectional view illustrating the structure of a semiconductor device according to Embodiment 6.
Figure 13:
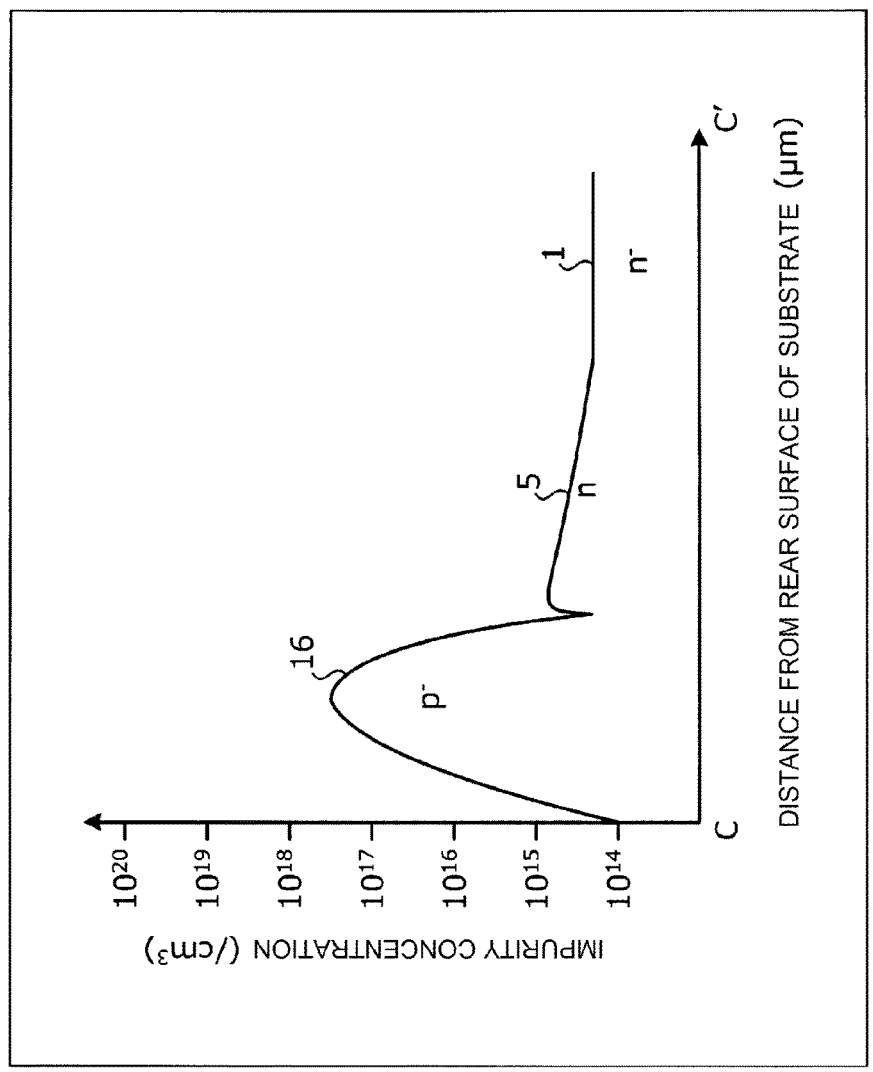
FIG. 13 is a characteristic diagram illustrating an impurity concentration distribution along the cutting line C-C' of FIG. 12.

Next, the structure of a semiconductor device according to Embodiment 6 will be described. FIG. 12 is a cross-sectional view illustrating the structure of the semiconductor device according to Embodiment 6. FIG. 13 is a characteristic diagram illustrating an impurity concentration distribution along the cutting line C-C' of FIG. 12. The impurity concentration distribution along the cutting line A-A' of FIG. 12 is the same as the impurity concentration distribution illustrated in FIG. 2. The semiconductor device according to Embodiment 6 differs from the semiconductor device according to Embodiment 5 in that a p− region (sixth semiconductor region) 16 is provided in an n buffer layer 5 in an edge termination structure portion 11 so as to come into contact with a cathode electrode 7, thereby forming a Schottky junction between the p− region 16 and the cathode electrode 7. An outer circumferential end portion 16a of the p− region 16 extends to a side surface 1a of an n− semiconductor substrate. The impurity concentration of the p− region 16 may be equal to the impurity concentration of a buried p layer 6.

A distance between an end portion 6a of the buried p layer 6 and the inner circumferential end portion 16b of the p− region 16 is a third length t3. According to this structure, since a potential difference occurs between the buried p layer 6 and the p− region 16, it is possible to prevent a jump in the I-V waveform, similarly to Embodiment 1. Specifically, the third length t3 between the end portion 6a of the buried p layer 6 and the inner circumferential end portion 16b of the p− region 16 is preferably equal to or greater than the width Xn of a built-in depletion layer at the pn junction between the n buffer layer 5 and the buried p layer 6, and equal to or less than the diffusion length $L_h$ of the minority carrier. The reason why the third length t3 is set to be equal to or less than the diffusion length $L_h$ of the minority carrier is to prevent a reduction in the effect obtained by the formation of the p− region 16.

The reason why the third length t3 is set to be equal to or greater than the width Xn of the built-in depletion layer at the pn junction between the n buffer layer 5 and the buried p layer 6 is as follows. In a thermal equilibrium state in which the forward voltage is not applied, the depletion layer (built-in depletion layer) is formed at the pn junction between the n buffer layer 5 and the buried p layer 6 in the n buffer layer 5. When the built-in depletion layer comes into contact with the p− region 16 in the thermal equilibrium state, the depletion layer which is spread from the pn junction between the n buffer layer 5 and the buried p layer 6 reaches the p− region 16 due to the holes which are injected from the anode by the application of the forward voltage and a jump in the I-V waveform occurs.

The width Xn of the built-in depletion layer at the pn junction between the n buffer layer 5 and the buried p layer 6 is represented by the following Expression (3). A built-in voltage $\Phi_b$ of the pn junction between the n buffer layer 5 and the buried p layer 6 is represented by the following Expression (4). In the following Expressions (3) and (4), the donor concentration of the n buffer layer 5 is $N_D$, the acceptor concentration of the buried p layer 6 is $N_A$, an elementary charge is q, a Boltzmann constant is K, an absolute temperature is T, intrinsic carrier concentration when the absolute temperature T is 300 K is $n_i$, vacuum permittivity is $\epsilon_0$, and the specific permittivity of silicon is $\epsilon_s$. In addition, KT/q indicates a thermal voltage when the absolute temperature T is 300 K.

[Expression 3]

$$Xn = \sqrt{\frac{2\varepsilon_S \varepsilon_0 N_A}{qN_D(N_D + N_A)}} \phi_b \qquad (3)$$

[Expression 4]

$$\phi_b = \frac{KT}{q} \log\left(\frac{N_D \cdot N_A}{n_i^2}\right) \qquad (4)$$

Specifically, the donor concentration $N_D$ of the n buffer layer 5 is $1.00 \times 10^{21}/cm^3$, the acceptor concentration $N_A$ of the buried p layer 6 is $1.00 \times 10^{23}/cm^3$, the intrinsic carrier concentration $n_i$ is $1.50 \times 10^{16}/cm^3$, KT/q is $2.60 \times 10^2$ eV, the vacuum permittivity $\epsilon_0$ is $8.85 \times 10^{-12}$ F/cm, the specific permittivity $\epsilon_s$ of silicon is $1.17 \times 10$ F/cm, and the elementary charge q is $1.60 \times 10^{19}$ C. Therefore, from the above-mentioned Expression (4), the built-in voltage $\Phi_b$ of the pn junction between the n buffer layer 5 and the buried p layer 6 is $6.87 \times 10^{-1}$ V. In addition, from the above-mentioned Expression (3), the width Xn of the built-in depletion layer at the pn junction between the n buffer layer 5 and the buried p layer 6 is 0.945 µm.

Next, an example of a method for manufacturing the semiconductor device according to Embodiment 6 will be described. In the semiconductor device manufacturing method according to Embodiment 6, after the buried p layer 6 is formed (Step S4), a resist mask in which a region for forming the n+ cathode layer 14 is opened is formed on the rear surface of the n− semiconductor substrate and the n+ cathode layer 14 is formed in the active region 10 using the resist mask as a mask in Step S5, unlike the semiconductor device manufacturing method according to Embodiment 1. In addition, after the resist mask for forming the n$^+$ cathode layer 14 is removed and before a heat treatment in Step S6, a resist mask in which a region for forming the p$^-$ region 16 is opened is formed and the p$^-$ region 16 is formed in the edge termination structure portion 11 using the resist mask as a mask. Then, in Step S6, the heat treatment is preferably performed to collectively activate the impurities implanted by an ion implantation process. The semiconductor device manufacturing method according to Embodiment 6 is the same as the semiconductor device manufacturing method according to Embodiment 1 except for the steps of forming the n$^+$ cathode layer 14 and the p$^-$ region 16.

As described above, according to Embodiment 6, it is possible to obtain the same effect as that in Embodiments 1 to 5. In addition, according to Embodiment 6, the n$^+$ cathode layer is not provided in the edge termination structure portion and the junction between the p$^-$ region and the cathode electrode is formed in the edge termination structure portion. Therefore, it is possible to obtain the same effect as that in Embodiment 5.

Embodiment 7

Figure 14:
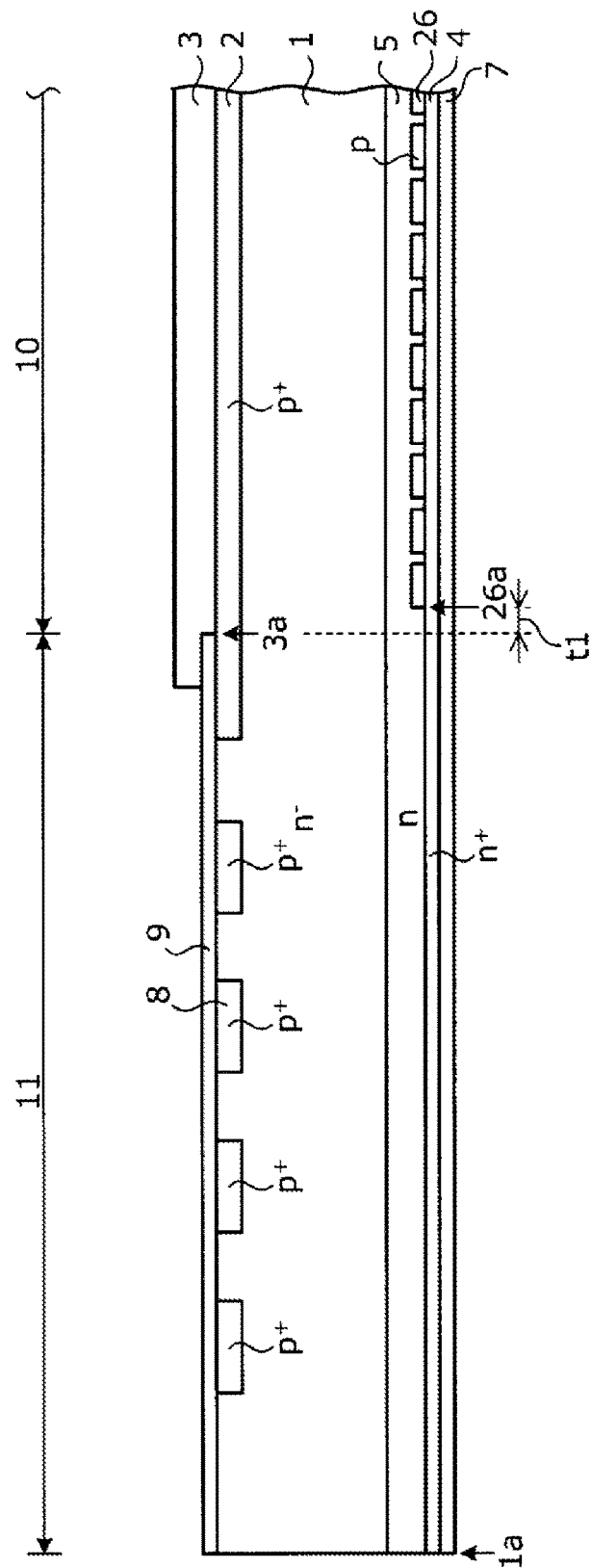
FIG. 14 is a cross-sectional view illustrating the structure of a semiconductor device according to Embodiment 7.
Figure 15:
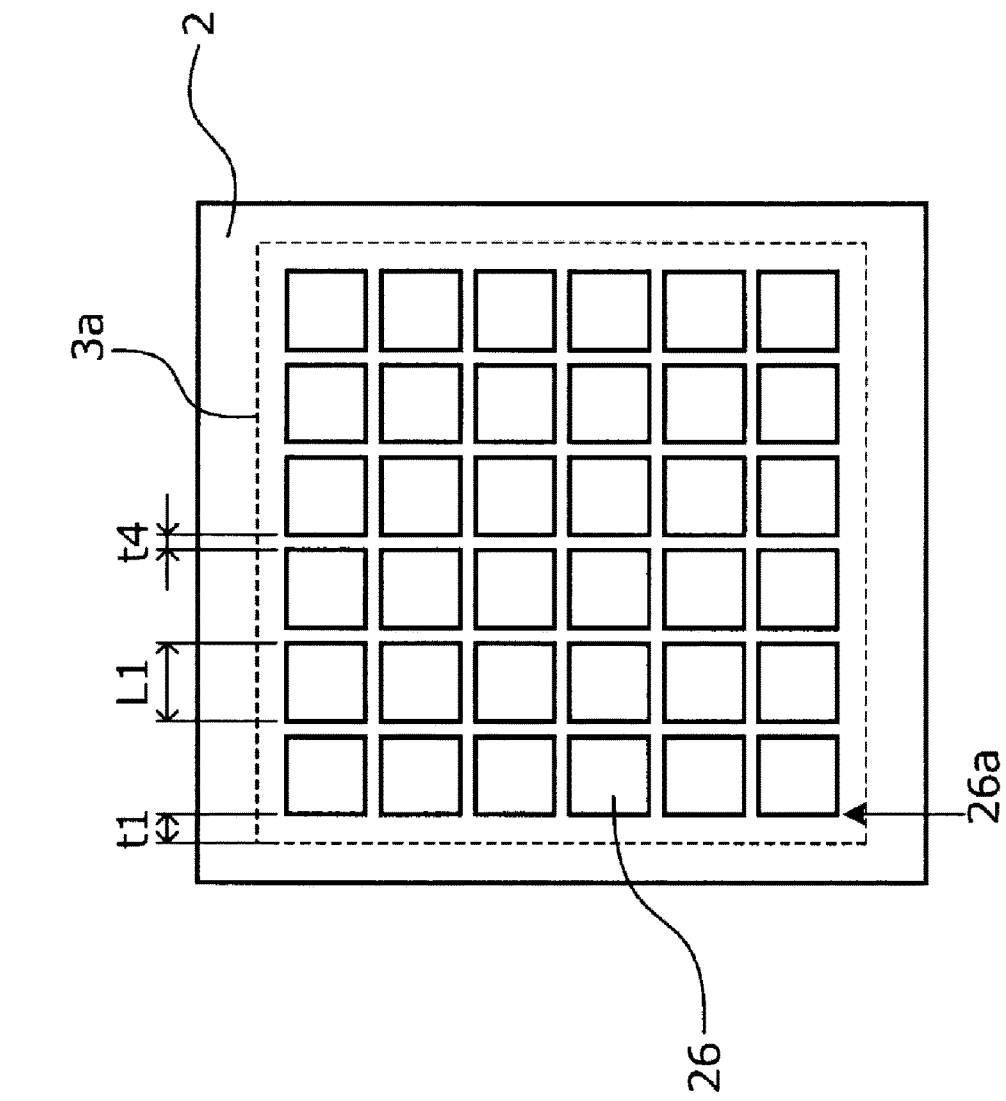
FIG. 15 is a plan view illustrating an example of the plane pattern of a buried p layer in the semiconductor device according to Embodiment 7.
Figure 16:
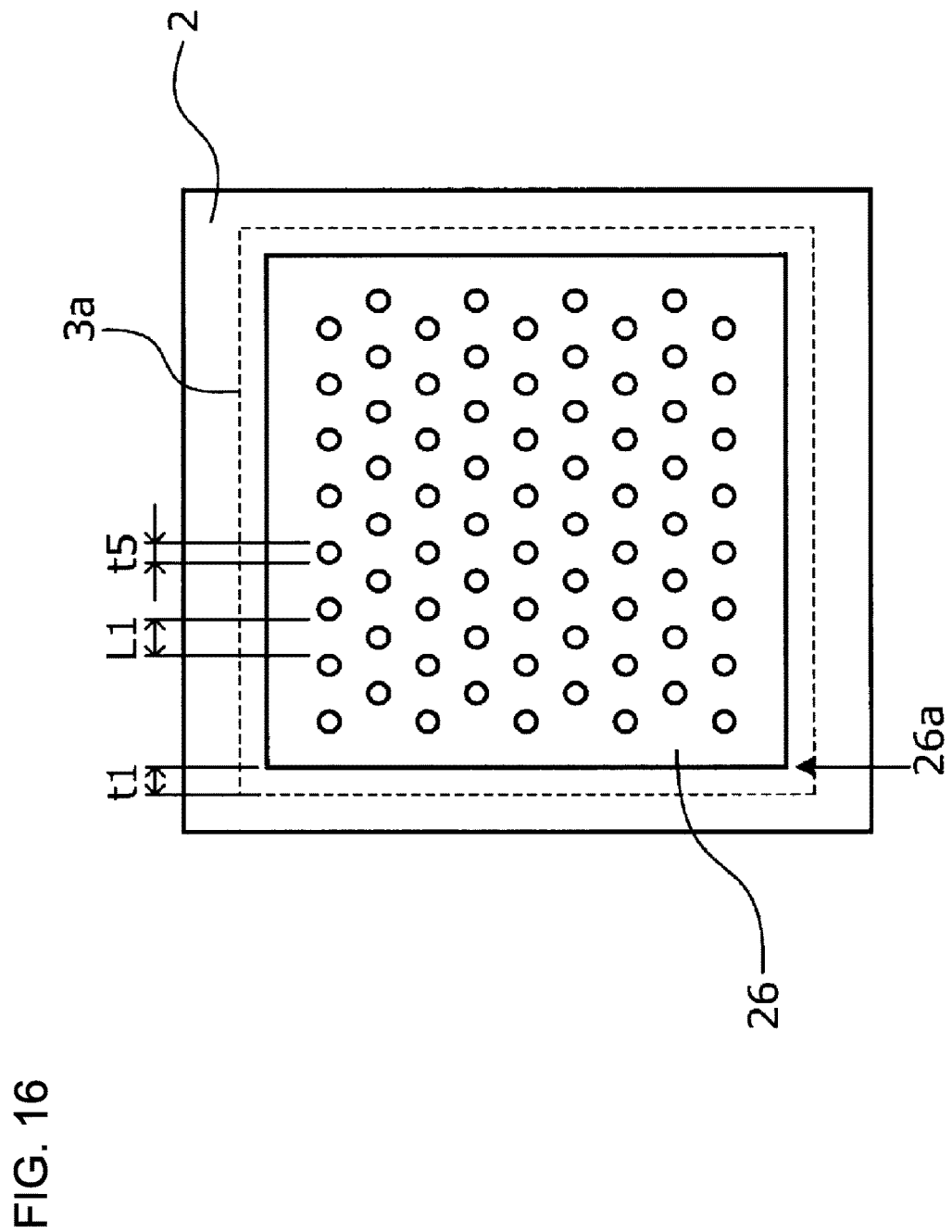
FIG. 16 is a plan view illustrating an example of the plane pattern of the buried p layer in the semiconductor device according to Embodiment 7.
Figure 17:
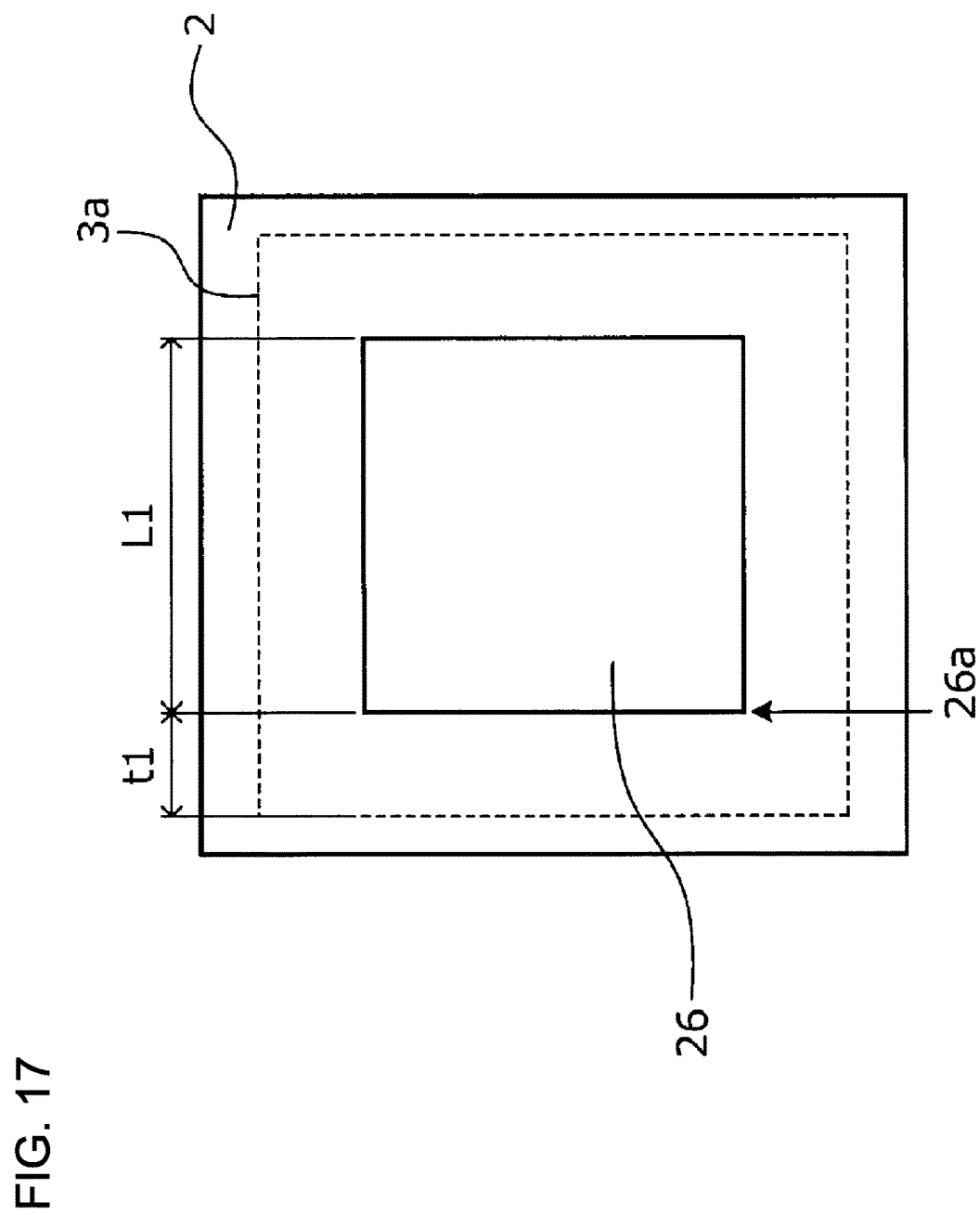
FIG. 17 is a plan view illustrating an example of the plane pattern of the buried p layer in the semiconductor device according to Embodiment 7.

Next, the structure of a semiconductor device according to Embodiment 7 will be described. FIG. 14 is a cross-sectional view illustrating the structure of the semiconductor device according to Embodiment 7. FIGS. 15 to 17 are plan views illustrating examples of the plane pattern of a buried p layer in a semiconductor device according to Embodiment 7. In FIGS. 15 to 17, the position of an end portion 3a of an anode contact which is projected from the front surface of a substrate to an n$^+$ cathode layer 4 on the rear surface of the substrate is represented by a dotted line (which holds for FIGS. 21 and 22). The semiconductor device according to Embodiment 7 differs from the semiconductor device according to Embodiment 1 in that a buried p layer 26 is selectively provided and the area ratio (=A11/A10) of the occupation area A11 of the surface area of the buried p layer 26 to the surface area A10 of a portion (e.g., the active region 10) which is disposed inside the end portion 3a of the anode contact is set in a predetermined range.

The area ratio of the occupation area A11 of the surface area of the buried p layer 26 to the surface area A10 of the portion which is disposed inside the end portion 3a of the anode contact may be equal to or greater than 90% and equal to or less than 98% and preferably equal to or greater than 92% and equal to or less than 96%. In this case, it is possible to obtain a low transient V$_F$ (on-voltage) and soft recovery characteristics. The surface area A10 of the portion which is disposed inside the end portion 3a of the anode contact means the surface area of the active region 10. The occupation area A11 of the surface area of the buried p layer 26 means the total surface area of the buried p layer 26. An end portion 26a of the pattern of the buried p layer 26 which is closest to the edge termination structure portion 11 is preferably located at a position that is a first length t1 inside from the end portion 3a of the anode contact (toward the center of the FWD cell), similarly to Embodiment 1. The first length t1 is preferably, for example, about 50 μm corresponding to the diffusion length L$_h$ of the minority carrier.

The plane pattern of the buried p layer 26 can vary depending on the design condition. For example, the plane pattern of the buried p layer 26 has a stripe shape, a matrix shape in which substantial rectangles or substantial dots are regularly arranged at predetermined intervals (that is, a shape in which the buried p layer 26 is opened in a lattice shape: FIG. 15), a shape in which substantially rectangular openings or substantially circular openings are regularly arranged in a matrix at predetermined intervals in the buried p layer 26 (FIG. 16), and a mosaic shape in which openings with an arbitrary shape are arranged in an arbitrary pattern. For example, the plane pattern of the buried p layer 26 may be the same plane pattern as that in Embodiment 1. That is, one buried p layer 26 with a substantially rectangular shape may be uniformly formed on the entire central portion of the active region 10 and a region in which the buried p layer 26 is not provided may be provided in a substantially rectangular frame shape around the buried p layer 26 in the active region 10. In this case, the width of the region, in which the buried p layer 26 is not provided, around the buried p layer 26 is preferably equal to the first length t1 which can obtain the above-mentioned area ratio.

Figure 18:
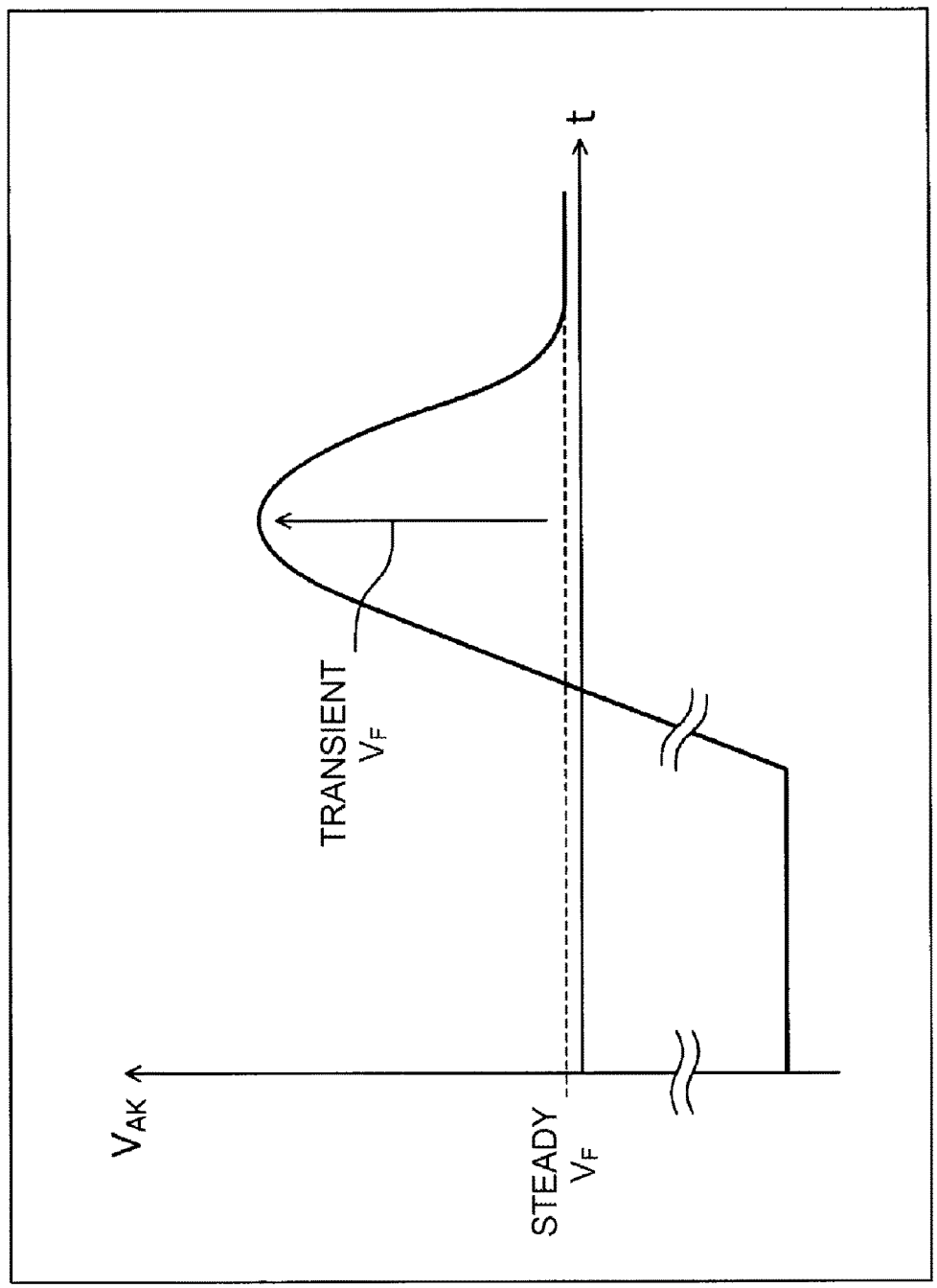
FIG. 18 is a characteristic diagram illustrating the voltage waveform of an FWD.

When a forward bias is applied, the buried p layer 26 which is uniformly formed hinders the injection of electrons from the n$^+$ cathode layer 4 to the n$^-$ drift region 1 and conductivity modulation is less likely to occur. As a result, there is a concern that a transient forward voltage will increase. The transient forward voltage is as follows. FIG. 18 is a characteristic diagram illustrating the voltage waveform of the FWD. As illustrated in FIG. 18, when the voltage changes from the reverse bias (for example, a power supply voltage of 600 V or more) to the forward bias during current blocking and the semiconductor device is turned on, the drop of a forward voltage V$_F$ (a voltage V$_{AK}$ between the anode and the cathode) increases temporarily while the carriers are stored in the n$^-$ drift region 1 (for example, about a few tens of volts). Then, when the storage of the carriers is completed, the semiconductor device is in a steady state and the forward voltage V$_F$ is converged on a steady-state value (for example, about 1 V to 3 V). The forward voltage V$_F$ which transiently increases while the voltage changes from the reverse bias to the forward bias and the semiconductor is turned on is referred to as the transient forward voltage (hereinafter, referred to as a transient V$_F$).

When the transient V$_F$ is high, electrical loss occurs during the actual operation of a machine, such as an inverter, and an element temperature increases due to the electrical loss. Therefore, it is preferable that the transient V$_F$ be low. For this reason, when the buried p layer 26 is formed, a portion of the buried p layer 26 is removed to form an opening portion (hole). In this way, when the forward bias is applied, electrons are injected from the n$^+$ cathode layer 4 to the n$^-$ drift region 1 through the opening portion, without being blocked by the buried p layer 26. That is, the opening portion of the buried p layer 26 serves as the path of the electrons injected from the n$^+$ cathode layer 4 to the n$^-$ drift region 1. The planar shape of the opening portion in the buried p layer 26 may be, for example, a lattice shape with a width t4 in which substantial rectangles with a fourth length (width) L1 remain in a matrix as illustrated in FIG. 15 or a shape in which circles with a diameter t5 are regularly arranged in a matrix at an interval of the fourth length L1 as illustrated in FIG. 16.

As illustrated in FIG. 17, when one buried p layer 26 having a substantially rectangular shape with the fourth length (width) L1 is uniformly formed on the entire surface of the central portion of the active region 10, the opening portion of the buried p layer 26 may have a substantially rectangular frame shape which surrounds the buried p layer 26. That is, this is equivalent to a structure in which the opening portion which serves as the path of the electrons injected from the n⁺ cathode layer 4 to the n⁻ drift region 1 is not formed in the buried p layer 26, but is formed around the buried p layer 26. In this case, the width (that is, the first length t1) of the opening portion of the buried p layer 26 may be greater than the diffusion length $L_h$ of the minority carrier or 50 μm. When the opening portion is formed in the buried p layer 26 in this way, the occupation area (=A10-A11) of the surface area of the region, which does not hinder the injection of electrons from the n⁺ cathode layer 4 to the n⁻ drift region 1, in the surface area A10 of the portion which is disposed inside the end portion 3a of the anode contact is ensured in a predetermined range.

When the forward bias is applied, the holes which are injected from the p⁺ anode layer 2 to the n⁻ drift region 1 cause a voltage drop in the buried p layer 26, move in the buried p layer 26, and reaches the n⁺ cathode layer 4 through the opening portion of the buried p layer 26. When the voltage drop is greater than the built-in potential of the pn junction between the buried p layer 26 and the n⁺ cathode layer 4, electrons are injected from the n⁺ cathode layer 4 to the buried p layer 26. In this case, when the length (fourth length L1) of the buried p layer 26 in a direction horizontal to the rear surface of the substrate is not sufficiently large, the movement distance of the holes which are injected from the p⁺ anode layer 2 to the n⁻ drift region 1 in the direction horizontal to the rear surface of the substrate is short and a voltage drop is reduced. Therefore, electrons are less likely to be injected from the n⁺ cathode layer 4 to the buried p layer 26. This causes an increase in the transient $V_F$ or a jump in the I-V waveform.

When the opening portion which serves the path of the electrons injected from the n⁺ cathode layer 4 to the n⁻ drift region 1 is provided around the buried p layer 26 as illustrated in FIG. 17, the sufficient length of the buried p layer 26 in the direction horizontal to the rear surface of the substrate is maintained. Therefore, when the opening portion which serves the path of the electrons injected from the n⁺ cathode layer 4 to the n⁻ drift region 1 is provided around the buried p layer 26 as illustrated in FIG. 17, it is easy to prevent an increase in the transient $V_F$ or a jump in the I-V waveform, as compared to the structure in which the opening portion is selectively provided in the buried p layer 26. In addition, in the case in which the opening portion which serves the path of the electrons injected from the n⁺ cathode layer 4 to the n⁻ drift region 1 is provided around the buried p layer 26 as illustrated in FIG. 17, when the ratio of the total surface area of the buried p layer 26 to the surface area A10 of the portion which is disposed inside the end portion 3a of the anode contact is equal to or greater than 50%, the soft recovery effect is sufficiently obtained during reverse recovery. In this case, the distance (that is, the first length t1) between the projected position of the end portion 3a of the anode contact on the rear surface of the substrate and the end portion 26a of the buried p layer 26 is preferably set to a value at which the area ratio of the occupation area A11 of the surface area of the buried p layer 26 is equal to or greater than 50%. For example, the distance is preferably equal to or less than 2000 μm.

In FIGS. 15 to 17, the length (fourth length) L1 of the buried p layer 26 in the direction horizontal to the rear surface of the substrate depends on the impurity concentration of the buried p layer 26 and can be calculated, for example, as follows. When current density is J, an elementary charge is q, hole mobility is μ, the thickness of the buried p layer 26 is d, the impurity concentration of the buried p layer 26 is Np, and the built-in potential of the pn junction between the buried p layer 26 and the n⁺ cathode layer 4 is Vbi, the length L1 of the buried p layer 26 in the direction horizontal to the rear surface of the substrate satisfies the following Expression (5).

$$L1 = \{(q \cdot \mu \cdot d \cdot Np \cdot Vbi)/J\}^{1/2} \quad \text{[Expression (5)]}$$

For example, assuming that hole mobility at room temperature (300K) is (cm²/Vs), the thickness of the cathode p layer is 1 μm, the p-type impurity concentration of the cathode p layer is 1×10¹⁷/cm³, and the current density J at which sufficient conductivity modulation occurs is 1 A/cm², the length L1 of the buried p layer 26 in the direction horizontal to the rear surface of the substrate is about 250 μm from the above-mentioned Expression (5). When the length L1 of the buried p layer 26 in the direction horizontal to the rear surface of the substrate is equal to or greater than 250 μm, it is possible to reduce the transient $V_F$. Therefore, the length L1 of the buried p layer 26 in the direction horizontal to the rear surface of the substrate may satisfy the following Expression (6).

$$L1 \geq \{(q \cdot \mu \cdot d \cdot Np \cdot Vbi)/J\}^{1/2} \quad \text{[Expression (6)]}$$

Next, a method for manufacturing the semiconductor device according to Embodiment 7 will be described. The semiconductor device manufacturing method according to Embodiment 7 differs from the semiconductor device manufacturing method according to Embodiment 1 in that, when the buried p layer 26 is formed, a mask in which the plane pattern of the buried p layer 26 is formed is used as an ion implantation mask. Specifically, first, a process from the formation of the front surface element structure to the formation of an n buffer layer 5 is performed, similarly to Steps S1 to S3 in Embodiment 1. Then, the n⁺ cathode layer 4 is formed on the rear surface of an n⁻ semiconductor substrate. A method for forming the n⁺ cathode layer 4 is the same as that in Embodiment 1.

Then, a resist mask in which a region for forming the buried p layer 26 is opened is formed on the rear surface of the n⁻ semiconductor substrate by photolithography. The resist mask covers, for example, the edge termination structure portion 11 and a portion of the active region 10 that is the first length t1 inside from the end portion of the anode contact hole. In addition, the pattern of the buried p layer 26 is formed in a portion of the resist mask which is disposed inside the end portion of the anode contact hole. Then, p-type impurity ions, such as boron ions, are implanted into the rear surface of the n⁻ semiconductor substrate, using the resist mask as a mask, to form the buried p layer 26.

The order in which the n⁺ cathode layer 4, the n buffer layer 5, and the buried p layer 26 are formed can be changed in various ways. Similarly to Embodiment 1, the n buffer layer 5, the buried p layer 26, and the n⁺ cathode layer 4 may be formed in this order. Then, similarly to Step S6 in Embodiment 1, thermal diffusion is collectively performed on the impurities which are implanted by the ion implantation process. Instead of the collective heat treatment, whenever impurities are implanted by the ion implantation process, thermal diffusion may be performed on the implanted impurities. Then, a process from the formation of an anode electrode 3 to the formation of a cathode electrode 7 is performed similarly to Steps S7 to S10 in Embodiment 1. In this way, the FWD illustrated in FIG. 14 is completed.

As described above, according to Embodiment 7, it is possible to obtain the same effect as that in Embodiments 1 to 6. In addition, according to Embodiment 7, the buried p layer 26 is provided inside the end portion 3a of the anode contact at a predetermined area ratio and the area ratio of the buried p layer is optimized. Therefore, it is possible to provide a semiconductor device which has soft recovery characteristics and a low transient $V_F$. In the structure disclosed in Patent Document 1, since the conductivity modulation of the pnpn structure portion is delayed, a high transient on-voltage is generated when the FWD is turned on. As a result, the switching loss of the FWD increases and the surge voltage increases when the IGBT of the opposite arm is turned off. In contrast, according to the invention, it is possible to obtain soft recovery and a low transient $V_F$. Therefore, the problems of the structure disclosed in Patent Document 1 do not occur.

Embodiment 8

Figure 19:
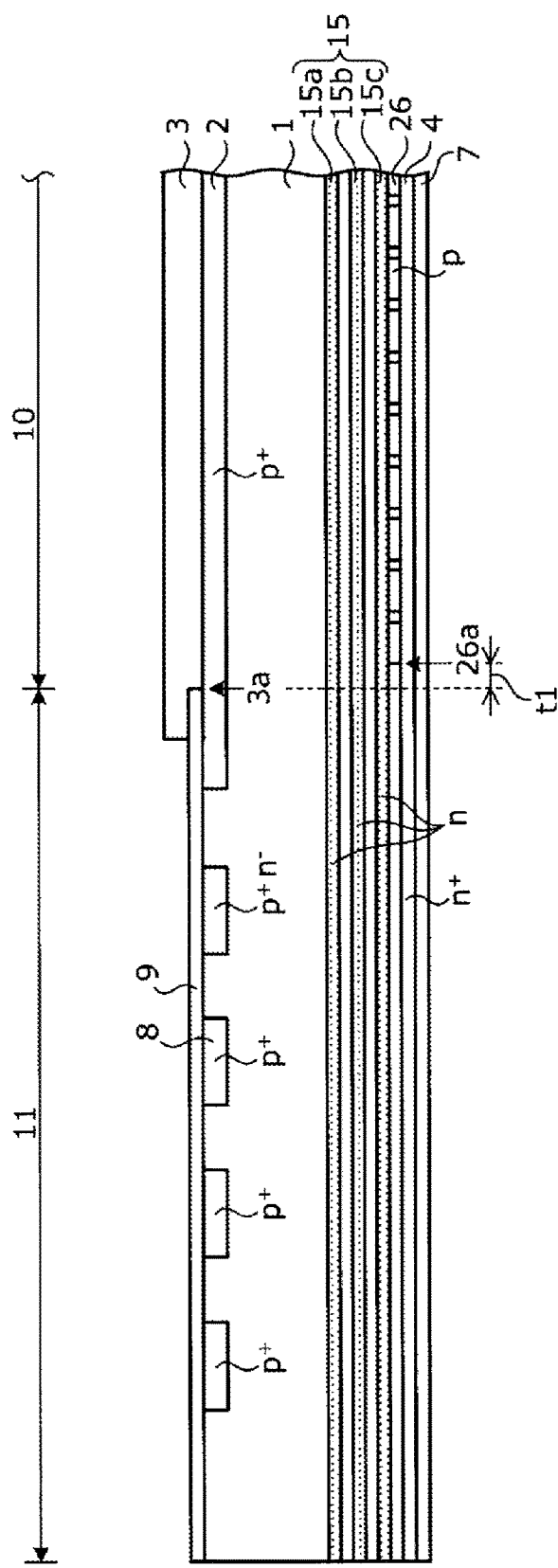
FIG. 19 is a cross-sectional view illustrating the structure of a semiconductor device according to Embodiment 8.

Next, the structure of a semiconductor device according to Embodiment 8 will be described. FIG. 19 is a cross-sectional view illustrating the structure of the semiconductor device according to Embodiment 8. The semiconductor device according to Embodiment 8 differs from the semiconductor device according to Embodiment 7 in that a plurality of n buffer layers 15 which have different depths from the rear surface of a substrate are formed by multi-stage irradiation with protons from the rear surface of the substrate. An n buffer layer 15 has the same structure as that in Embodiment 4. That is, for example, when the n buffer layer 15 is formed by three-stage irradiation with protons, the n buffer layer 15 includes n buffer layers 15a to 15c in ascending order of depth from the rear surface of an n⁻ semiconductor substrate.

A method for manufacturing the semiconductor device according to Embodiment 8 differs from the semiconductor device manufacturing method according to Embodiment 4 in that, when a buried p layer 26 is formed, an ion implantation mask in which the plane pattern of the buried p layer 26 is formed in a portion that is disposed inside an end portion of an anode contact hole is used, similarly to Embodiment 7. The semiconductor device manufacturing method according to Embodiment 8 is the same as the semiconductor device manufacturing method according to Embodiment 4 except for a step of forming the buried p layer 26.

As described above, according to Embodiment 8, it is possible to obtain the same effect as that in Embodiments 1 to 7.

Embodiment 9

Figure 20:
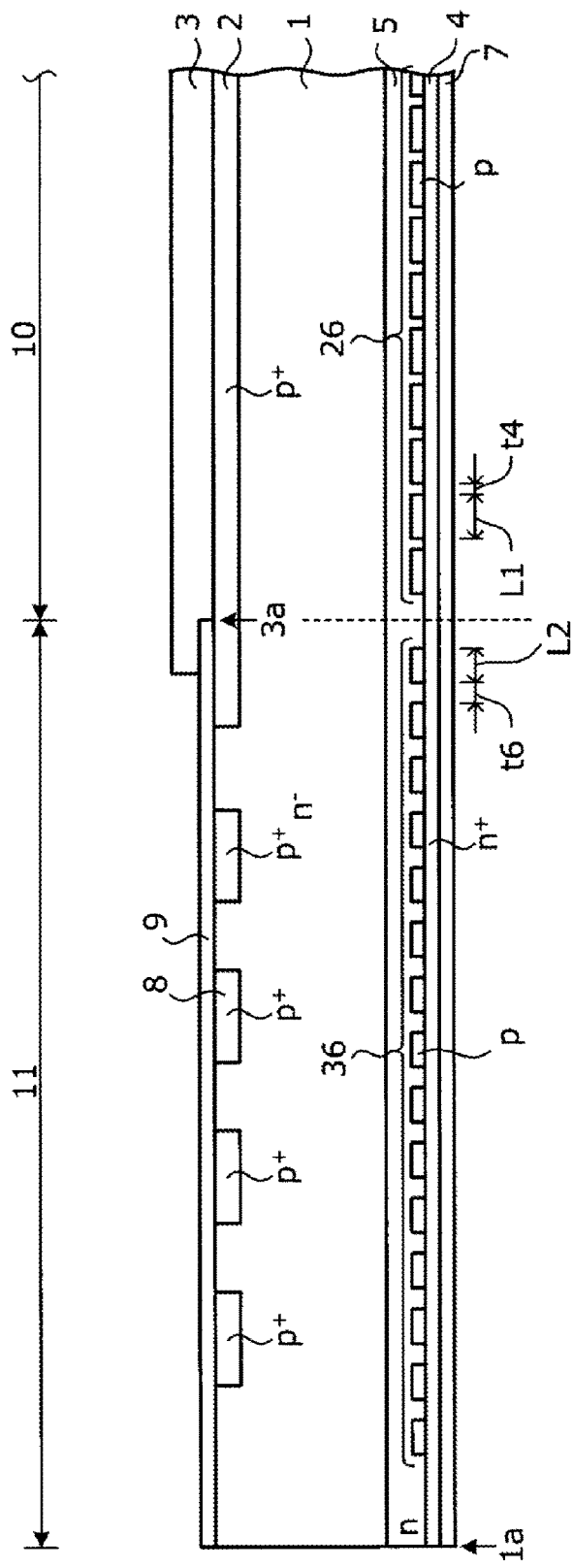
FIG. 20 is a cross-sectional view illustrating the structure of a semiconductor device according to Embodiment 9.
Figure 21:
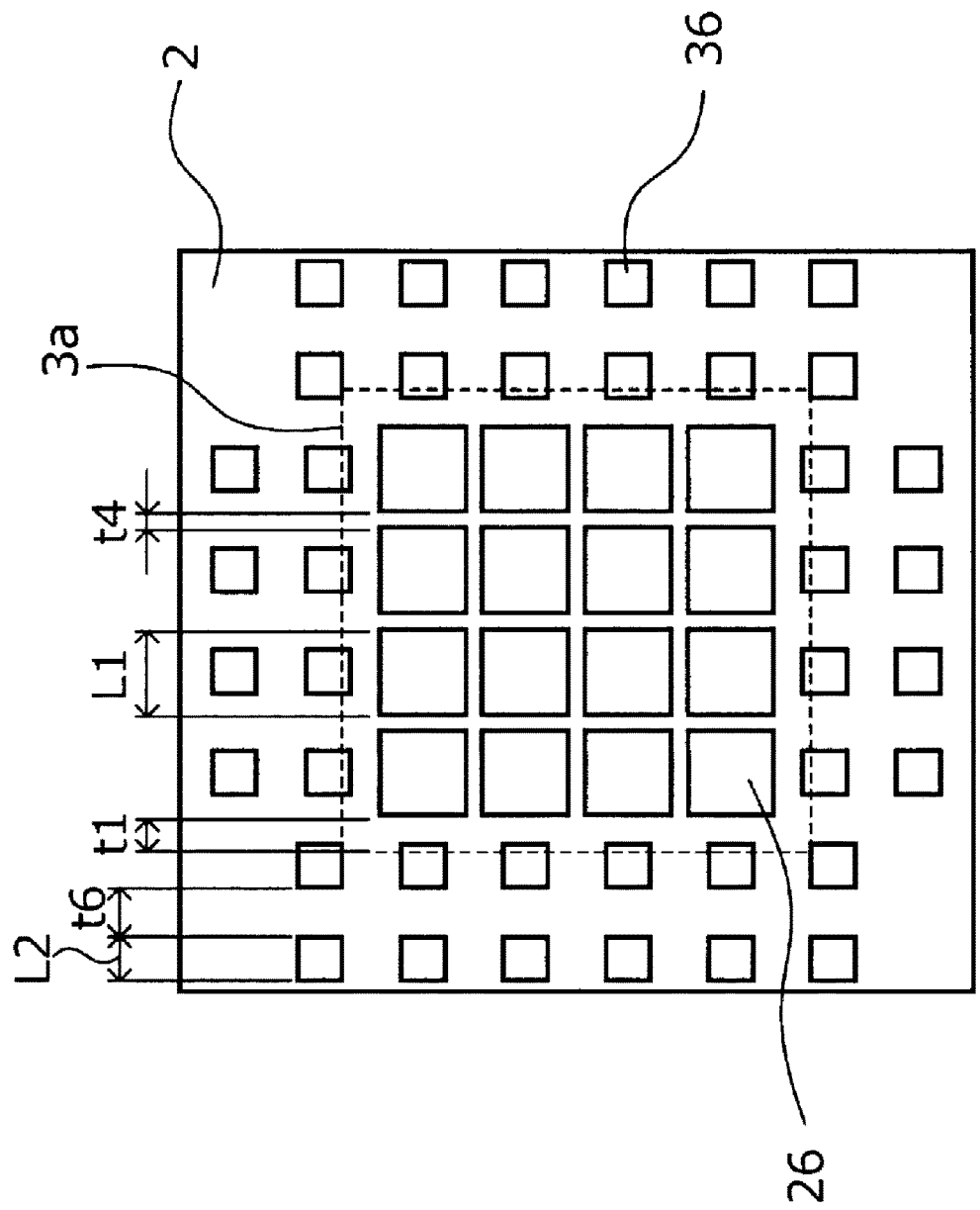
FIG. 21 is a plan view illustrating an example of the plane pattern of a buried p layer illustrated in FIG. 20.

Next, the structure of a semiconductor device according to Embodiment 9 will be described. FIG. 20 is a cross-sectional view illustrating the structure of the semiconductor device according to Embodiment 9. FIG. 21 is a plan view illustrating an example of the plane pattern of a buried p layer illustrated in FIG. 20. FIG. 21 illustrates an example in which buried p layer (hereinafter, referred to as first and second buried p layers) 26 and 36 are regularly arranged in a matrix at predetermined intervals. The semiconductor device according to Embodiment 9 differs from the semiconductor device according to Embodiment 7 in that the second buried p layer 36 is selectively provided in an edge termination structure portion 11 and the area ratio (=A21/A20) of the occupation area A21 of the surface area of the second buried p layer 36 in the edge termination structure portion 11 to the surface area A20 of a portion which is disposed outside an end portion 3a of an anode contact is set in a predetermined range.

Specifically, the area ratio of the occupation area A21 of the surface area of the second buried p layer 36 in the edge termination structure portion 11 to the surface area A20 of the portion which is disposed outside the end portion 3a of the anode contact is less than the area ratio of the occupation area A11 of the surface area of the first buried p layer 26 to the surface area A10 of a portion which is disposed inside the end portion 3a of the anode contact. Therefore, when dynamic avalanche occurs, the breakdown voltage of the edge termination structure portion 11 is greater than the breakdown voltage of an active region 10. As a result, the breakdown voltage of the active region 10 is a standard in an avalanche during reverse recovery. Therefore, it is possible to avoid the concentration of a current on the end portion 3a of the anode contact during reverse recovery and to improve the breakdown voltage.

Specifically, the second buried p layer 36 is arranged in the range from the vicinity of the boundary between the end portion 3a (active region 10) of the rectangular anode contact and the edge termination structure portion 11 to the edge termination structure portion 11 so as to be laid across the end portion 3a of the anode contact. The width t6 of an opening portion in the second buried p layer 36 is greater than that in the first buried p layer 26 which is disposed inside the end portion 3a and the anode contact and the length L2 of the second buried p layer 36 in a direction horizontal or parallel to the rear surface of the substrate is less than that in the first buried p layer 26 (t6>t4 and L2<L1). For example, the first buried p layer 26 has the same structure as that in Embodiment 7. As such, since the second buried p layer 36 is provided in the edge termination structure portion 11, it is possible to further reduce the transient $V_F$ and to further improve soft recovery characteristics.

As described above, according to Embodiment 9, it is possible to obtain the same effect as that in Embodiments 1 to 8.

Embodiment 10

Figure 22:
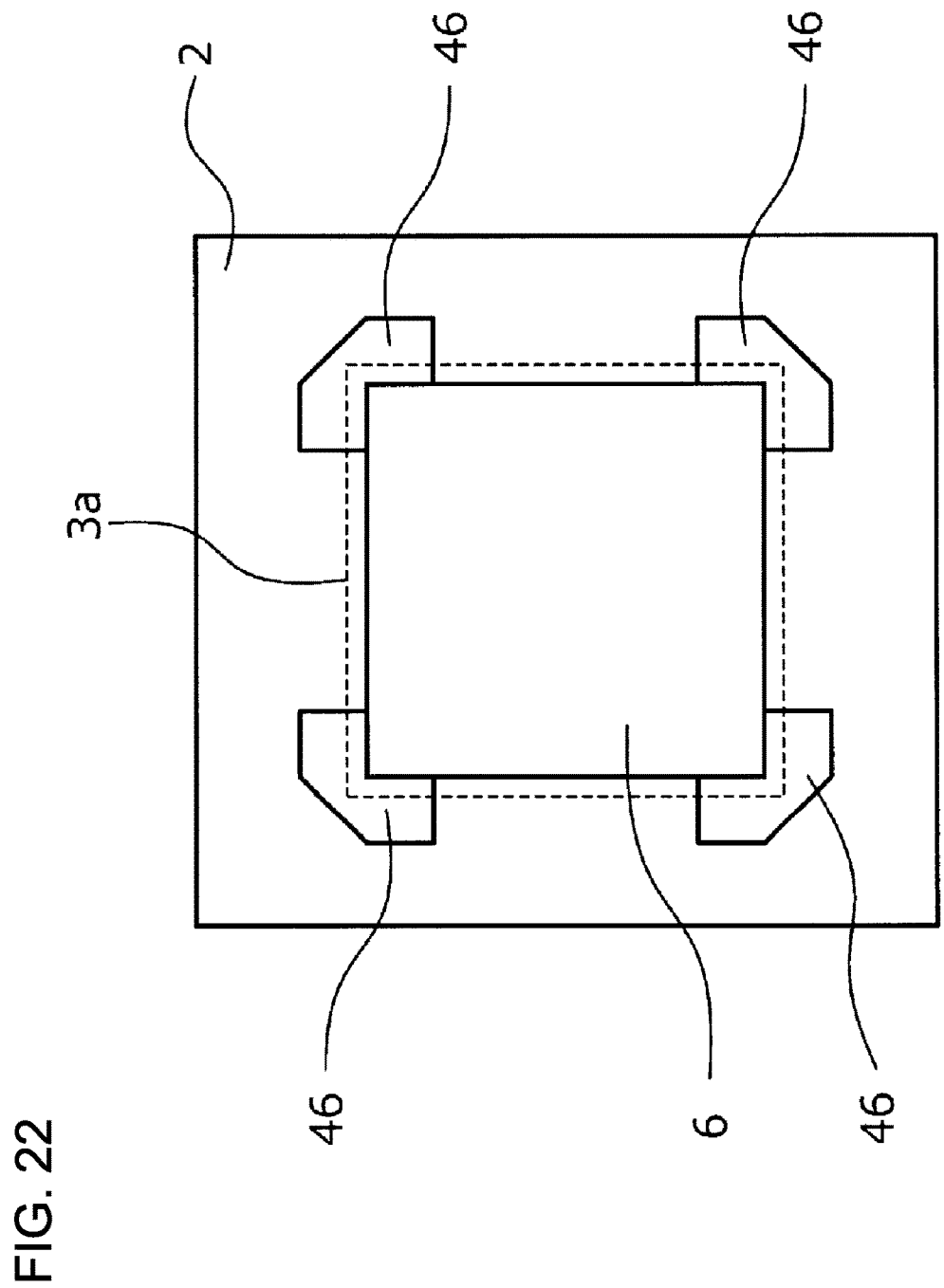
FIG. 22 is a plan view illustrating the structure of a semiconductor device according to Embodiment 10.

Next, the structure of a semiconductor device according to Embodiment 10 will be described. FIG. 22 is a plan view illustrating the structure of the semiconductor device according to Embodiment 10. FIG. 22 illustrates an example of the plane pattern of a buried p layer. The semiconductor device according to Embodiment 10 differs from the semiconductor device according to Embodiment 1 in that second buried p layers 46 are provided at four corners of an end portion 3a of a rectangular anode contact so as to be laid across the vicinity of the boundary between the end portion 3a of the anode contact and an edge termination structure portion 11. The second buried p layer 46 comes into contact with a buried p layer (hereinafter, referred to as a first buried p layer) 6 which is disposed inside the end portion 3a of the anode contact.

In Embodiment 10, when dynamic avalanche occurs, the breakdown voltage of the edge termination structure portion 11 is reduced at the corners of the end portion 3a of the anode contact. However, when the forward bias is applied, conductivity modulation is less likely to occur at the corners of the end portion 3a of the anode contact. The holes which are injected from a p⁺ anode layer 2 to an n⁻ drift region 1 when dynamic avalanche occurs flows to a contact surface of an anode electrode 3 which is surrounded by the end portion 3a of the anode contact according to electrostatic potential. The number of carriers stored in the edge termination structure portion 11 is reduced at the corners of the end portion 3a of the anode contact. Therefore, when the forward bias is applied, the concentration of a current on the corners of the end portion 3a of the anode contact is reduced. As a result, during reverse recovery, the concentration of a current on the corners of the end portion 3a of the anode contact is also reduced.

As described above, according to Embodiment 10, it is possible to obtain the same effect as that in Embodiments 1 to 9.

Example 1

Figure 23:
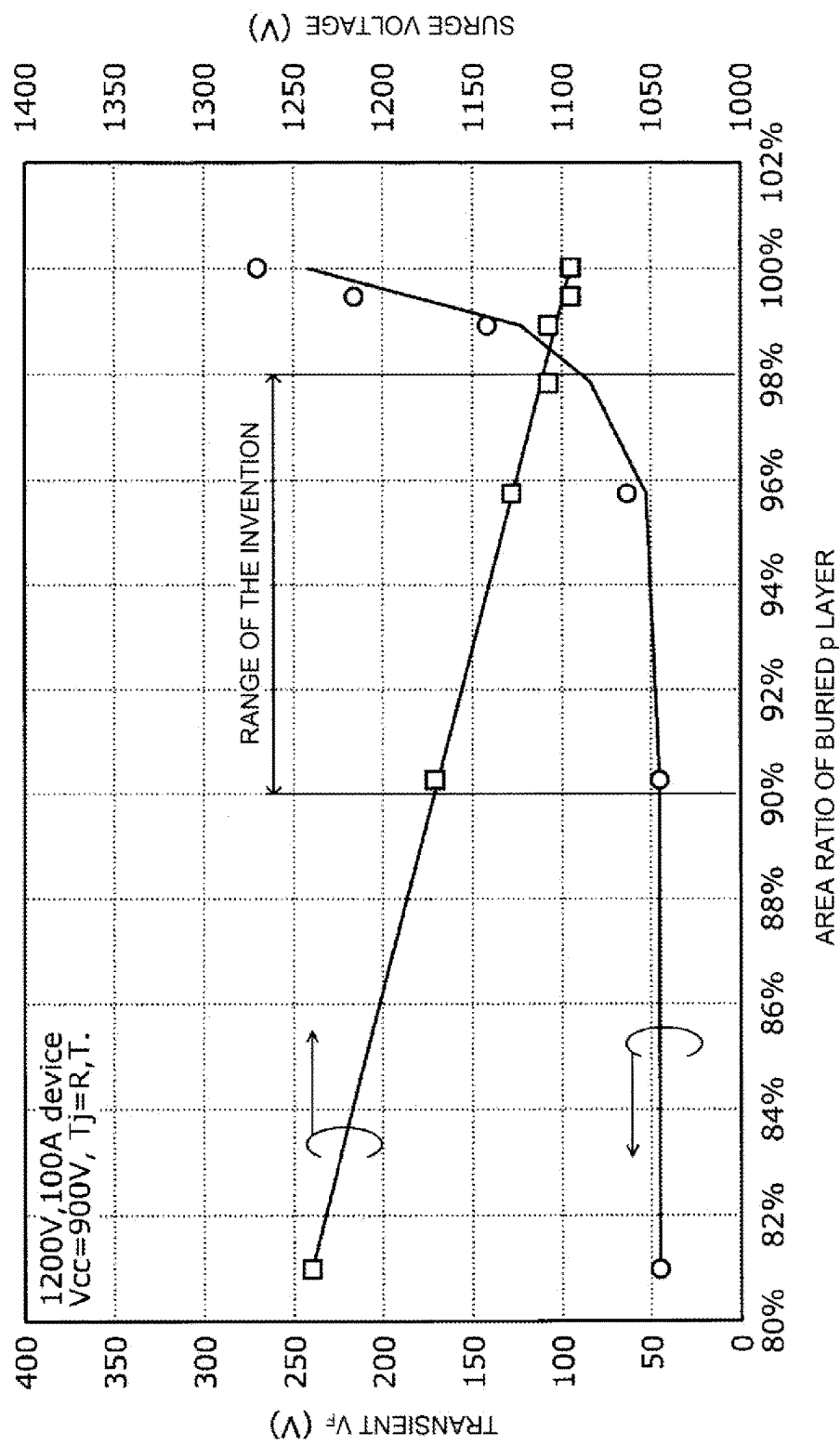
FIG. 23 is a characteristic diagram illustrating the relationship among a transient forward voltage, a surge voltage during reverse recovery, and the area ratio of a buried p layer in a semiconductor device according to Example 1.

Next, the relationship among a transient $V_F$ (on-voltage), a surge voltage during reverse recovery, and the area ratio of a buried p layer was verified. FIG. 23 is a characteristic diagram illustrating the relationship among a transient forward voltage, a surge voltage during reverse recovery, and the area ratio of a buried p layer in a semiconductor device according to Example 1. An FWD (hereinafter, referred to as Example 1) in which the area ratio of a buried p layer was changed to various values was manufactured by the semiconductor device manufacturing method according to Embodiment 7 and the transient $V_F$ (on-voltage) and the surge voltage during the reverse recovery were measured. FIG. 23 illustrates the measurement results. In Example 1, a breakdown voltage was 1200 V, a rated current was 100 A, a power supply voltage Vcc was 900 V, a junction (pn junction) temperature Tj was the room temperature (for example, 25° C.)

When the occupation area A11 of the surface area of the buried p layer 26 is high, it is easy to achieve soft recovery, but the transient on-voltage (transient forward voltage) increases. On the other hand, when the occupation area A11 of the surface area of the buried p layer 26 is low, the transient on-voltage is reduced, but it is difficult to achieve soft recovery. The results illustrated in FIG. 23 proved that, when the area ratio of the occupation area A11 of the surface area of the buried p layer 26 to the surface area A10 of the portion which was disposed inside the end portion 3a of the anode contact was equal to or greater than 90% and equal to or less than 98% and preferably equal to or greater than 92% and equal to or less than 96%, it was possible to reduce the transient $V_F$ and to achieve soft recovery.

When the transient $V_F$ is equal to or less than 100 V and the surge voltage is equal to or less than 1170 V, it is possible to achieve a low transient $V_F$ and soft recovery. The reason why the transient $V_F$ is set to 100 V or less is that, when the transient $V_F$ is greater than 100 V, electrical loss increases during the operation of an inverter. The reason why the surge voltage is set to 1170 V or less is to reduce damage due to an electrical load which is applied to a diode by the surge voltage.

Embodiment 11

Figure 24:
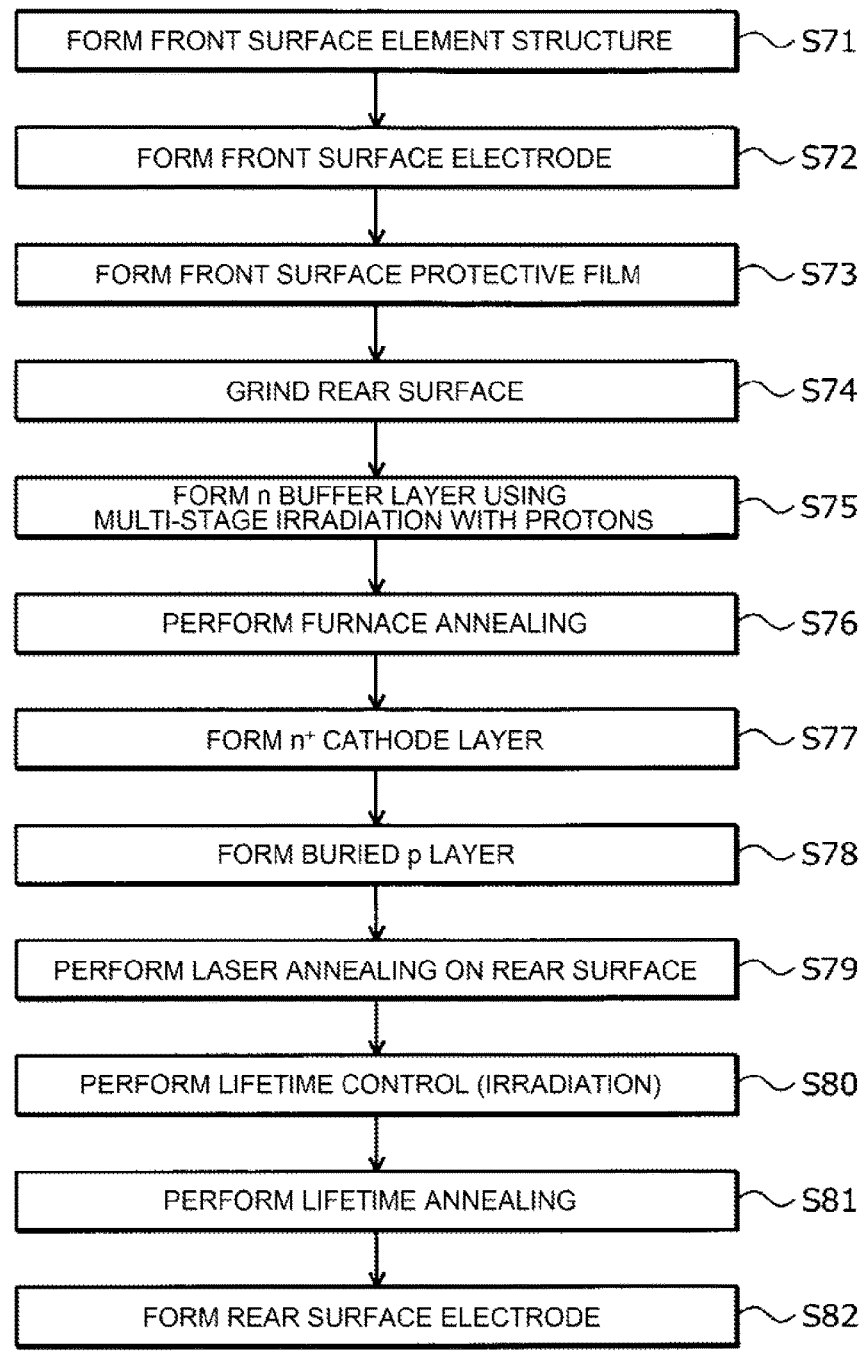
FIG. 24 is a flowchart illustrating the outline of a semiconductor device manufacturing method according to Embodiment 11.

Next, a semiconductor device manufacturing method according to Embodiment 11 will be described. FIG. 24 is a flowchart illustrating the outline of the semiconductor device manufacturing method according to Embodiment 11. The semiconductor device manufacturing method according to Embodiment 11 differs from the semiconductor device manufacturing method according to Embodiment 4 in that, after a front surface protective film is formed, each process (hereinafter, referred to as a rear surface forming process) is performed on the rear surface of a substrate.

Specifically, first, a front surface element structure and an anode electrode 3 are formed on the front surface side of an $n^-$ semiconductor substrate which will be an $n^-$ drift region 1 (Steps S71 and 72) and a passivation film is formed on the front surface side of the $n^-$ semiconductor substrate (Step S73). A method for forming the front surface element structure, a method for forming the anode electrode 3, and a method for forming the passivation film are the same as those in Embodiment 1. Then, the rear surface of the $n^-$ semiconductor substrate is ground to reduce the thickness of the $n^-$ semiconductor substrate (Step S74). Then, similarly to Embodiment 4, for example, three proton irradiation processes are performed in different ranges from the rear surface of the $n^-$ semiconductor substrate to form n buffer layers 15a to 15c at different depths from the rear surface of the substrate (Step S75). Then, for example, furnace annealing is performed to activate the protons injected into the $n^-$ semiconductor substrate (Step S76). Then, n-type impurity ions, such as phosphorus ions, are implanted into the entire rear surface of the $n^-$ semiconductor substrate to form an $n^+$ cathode layer 4 (Step S77).

Then, a resist mask in which a region for forming a buried p layer 6 is opened is formed on the rear surface of the $n^-$ semiconductor substrate. Then, the buried p layer 6 is formed at a position that is deeper than the $n^+$ cathode layer 4 and is shallower than the n buffer layer 15c from the rear surface of the substrate, using the resist mask as a mask (Step S78). Then, after the resist mask is removed, laser annealing is performed on the rear surface of the $n^-$ semiconductor substrate to activate the $n^+$ cathode layer 4 (Step S79). Then, an irradiation process and an annealing process which control the lifetime of carriers in the $n^-$ drift region 1 are performed (Steps S80 and S81). A lifetime control method in Steps S80 and S81 is the same as that in Embodiment 1. Then, a cathode electrode 7 is formed on the rear surface of the $n^-$ semiconductor substrate (Step S82). In this way, the FWD illustrated in FIG. 8 is completed.

As described above, according to Embodiment 11, it is possible to obtain the same effect as that in Embodiments 1 to 4.

Embodiment 12

Figure 25:
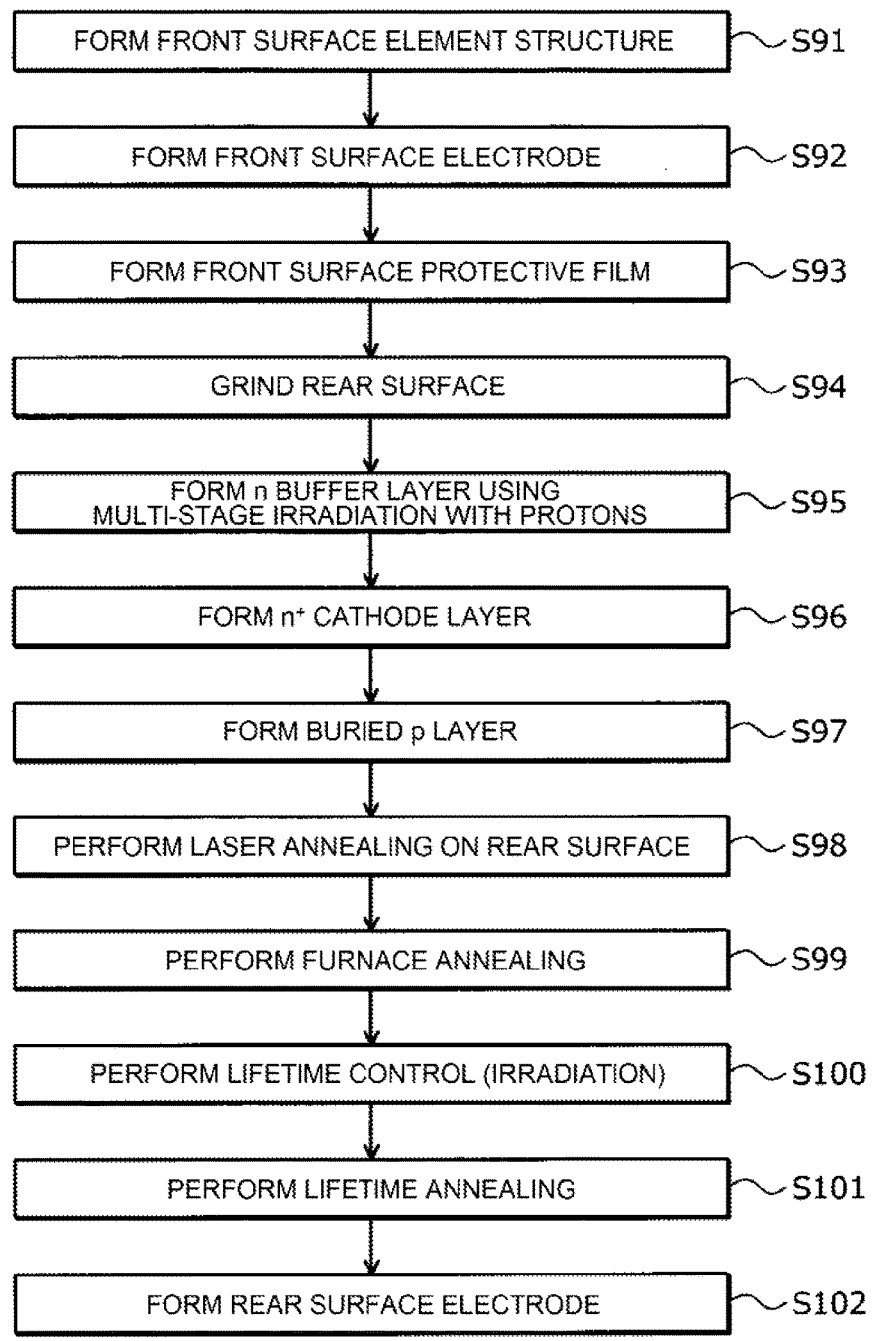
FIG. 25 is a flowchart illustrating the outline of a semiconductor device manufacturing method according to Embodiment 12.

Next, a semiconductor device manufacturing method according to Embodiment 12 will be described. FIG. 25 is a flowchart illustrating the outline of the semiconductor device manufacturing method according to Embodiment 12. The semiconductor device manufacturing method according to Embodiment 12 differs from the semiconductor device manufacturing method according to Embodiment 11 in that, after laser annealing for activating an $n^+$ cathode layer 4 and a buried p layer 6 is performed, furnace annealing is performed to activate n buffer layers 15a to 15c.

Specifically, first, similarly to Embodiment 11, a process from the formation of a front surface element structure to the formation of the n buffer layers 15a to 15c is performed (Step S91 to S95). Then, similarly to Embodiment 11, a process from the formation of an $n^+$ cathode layer 4 to laser annealing for activating the $n^+$ cathode layer 4 and the buried p layer 6 is performed (Steps S96 to S98). Then, furnace annealing is performed to activate the n buffer layers 15a to 15c (Step S99). Then, similarly to Embodiment 11, a process from the control of the lifetime to the formation of a cathode electrode 7 is performed (Steps S100 to S102). In this way, the FWD illustrated in FIG. 8 is completed.

As described above, according to Embodiment 12, it is possible to obtain the same effect as that in Embodiments 1 to 4 and Embodiment 11.

Embodiment 13

Figure 26:
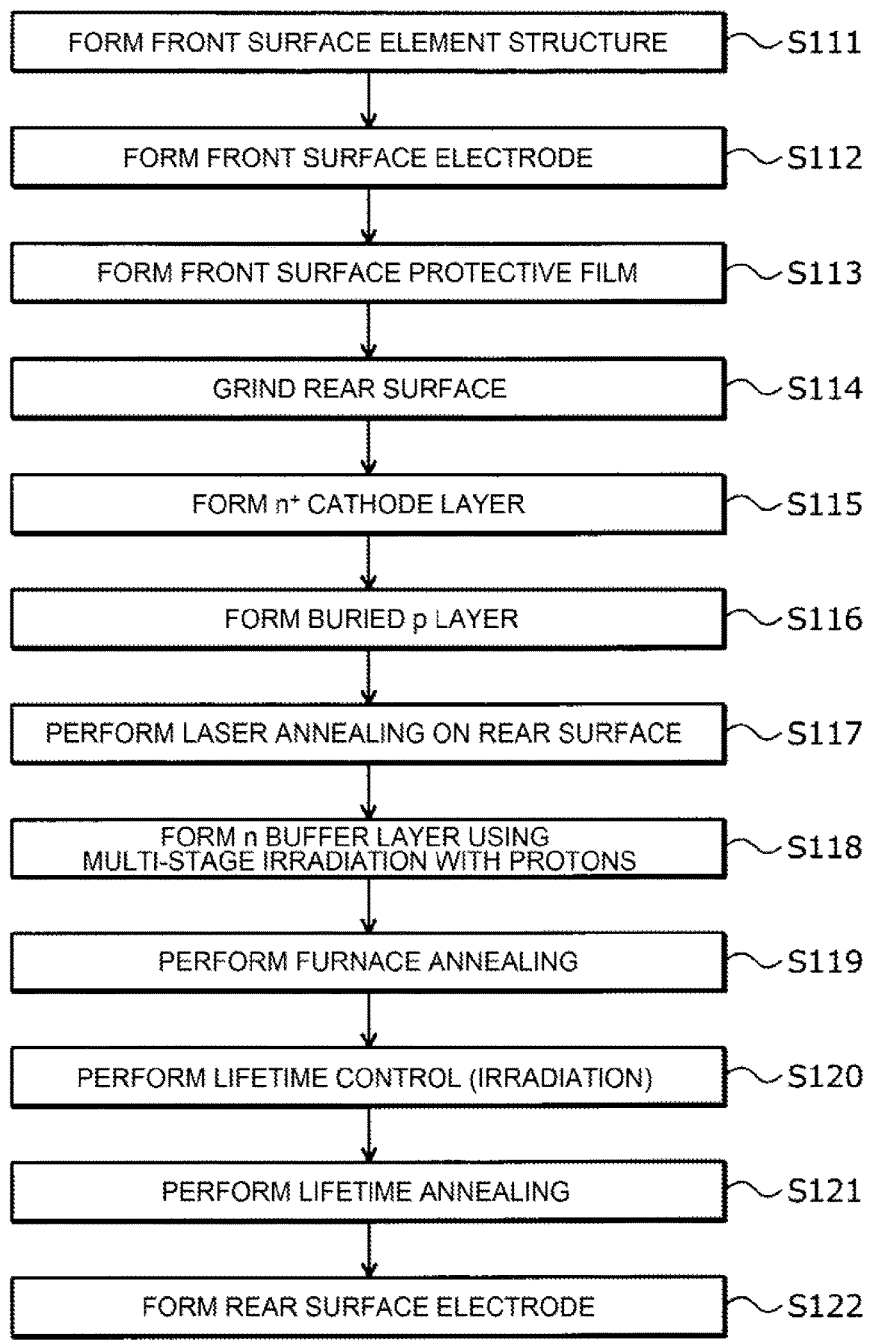
FIG. 26 is a flowchart illustrating the outline of a semiconductor device manufacturing method according to Embodiment 13.

Next, a semiconductor device manufacturing method according to Embodiment 13 will be described. FIG. 26 is a flowchart illustrating the outline of the semiconductor device manufacturing method according to Embodiment 13. The semiconductor device manufacturing method according to Embodiment 13 differs from the semiconductor device manufacturing method according to Embodiment 11 in that, after laser annealing for activating an $n^+$ cathode layer 4 and a buried p layer 6 is performed, n buffer layers 15a to 15c are formed by proton irradiation and furnace annealing is performed to activate the n buffer layers 15a to 15c.

Specifically, first, similarly to Embodiment 11, a process from the formation of a front surface element structure to the grinding of the rear surface of an $n^-$ semiconductor substrate is formed (Step S111 to S114). Then, similarly to Embodiment 11, a process from the formation of an $n^+$ cathode layer 4 to laser annealing for activating the $n^+$ cathode layer 4 and the buried p layer 6 is performed (Steps S115 to S117). Then, the n buffer layers 15a to 15c are formed at different depths from the rear surface of the substrate by multi-stage irradiation with protons from the rear surface of the substrate (Step S118). A method for forming the n buffer layers 15a to 15c is the same as that in Embodiment 4. Then, furnace annealing is performed to activate the n buffer layers 15a to 15c (Step S119). Then, similarly to Embodiment 11, a process from the control of the lifetime to the formation of a cathode electrode 7 is performed (Steps S120 to S122). In this way, the FWD illustrated in FIG. 8 is completed.

Figure 28:
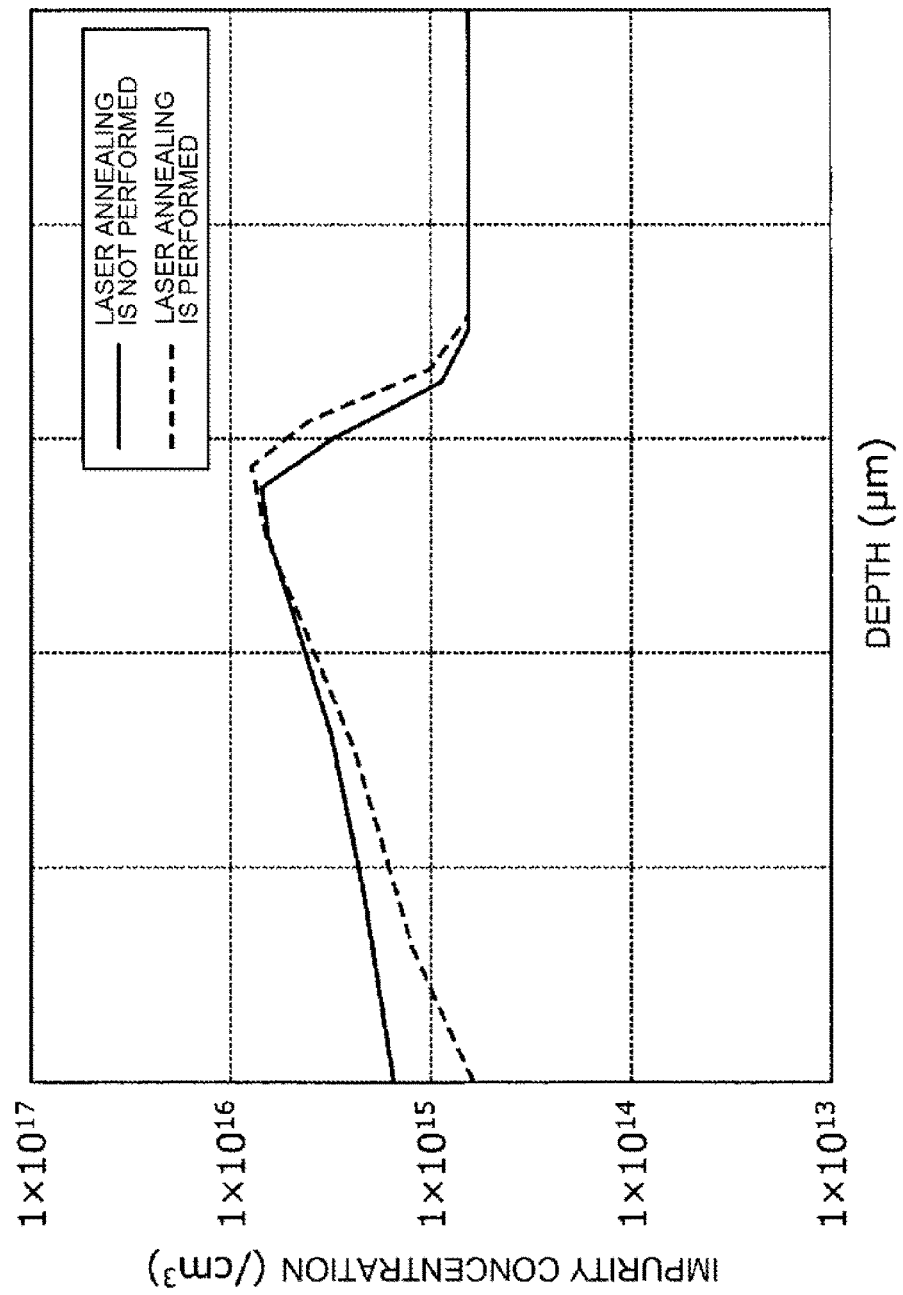
FIG. 28 is a characteristic diagram illustrating an impurity concentration distribution on the rear surface side of a substrate in a semiconductor device according to Example 2.
Figure 29:
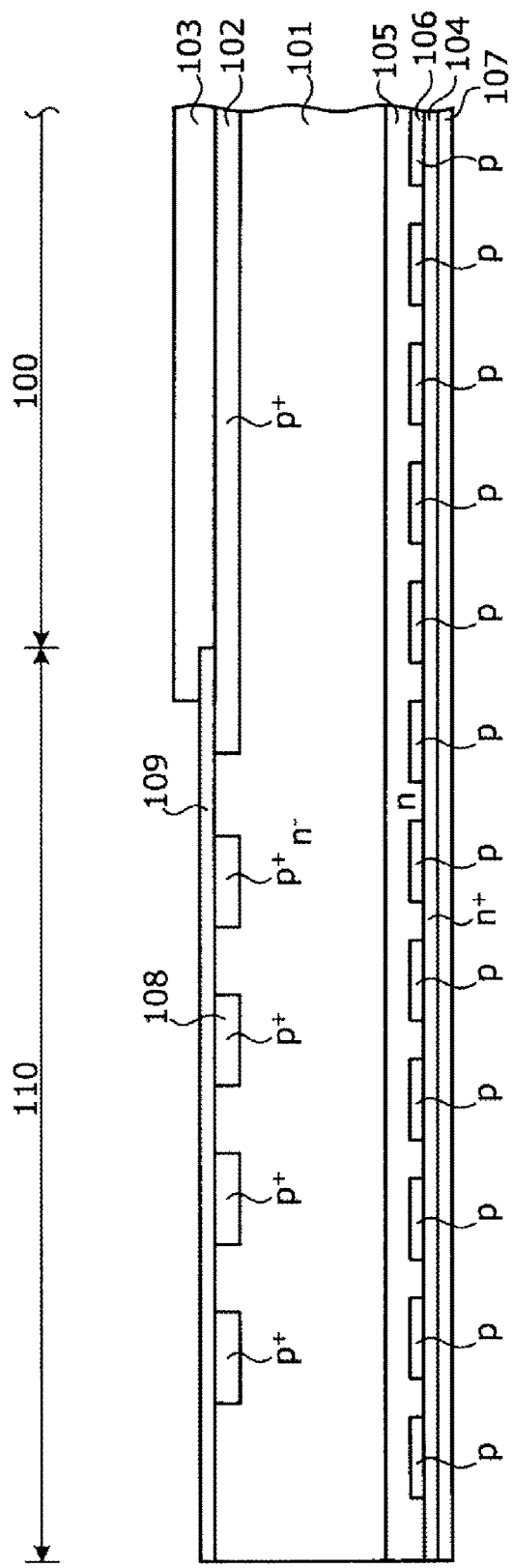
FIG. 29 is a cross-sectional view illustrating the structure of an FWD according to the related art.

Then, the impurity concentration of an $n^-$ drift region 1 and an n buffer layer 15 in a semiconductor device manufactured by the semiconductor device manufacturing method according to Embodiment 13 was verified. FIG. 28 is a characteristic diagram illustrating an impurity concentration distribution on the rear surface side of a substrate in a semiconductor device according to Example 2. An FWD (hereinafter, referred to as Example 2) was manufactured by the semiconductor device manufacturing method according to Embodiment 13 and the impurity concentration of the $n^-$ drift region 1 and the n buffer layer 15 was measured. The measurement result is illustrated in FIG. 28. FIG. 28 illustrates the impurity concentration (donor concentration) distribution of the first-stage n buffer layer 15a, which is arranged at the deepest position from the rear surface of the substrate, in a depth direction from the rear surface of the substrate. In FIG. 28, a starting point of the horizontal axis is the interface between the n buffer layer 15a and a portion of the $n^-$ drift region 1 which is interposed between the n buffer layers 15a and 15b.

That is, FIG. 28 illustrates the donor concentration distribution of the first-stage n buffer layer 15a, which is formed by multi-stage irradiation with protons, in a direction from the rear surface to the front surface of the substrate. A portion of the $n^-$ drift region 1 which is closer to the front surface of the substrate than the n buffer layer 15a has a uniform impurity concentration distribution at a position deeper than a position with the impurity concentration peak of the n buffer layer 15a. In addition, for comparison, FIG. 28 illustrates the impurity concentration distribution of an FWD (hereinafter, referred to as a comparative example), which is manufactured without performing laser annealing on the rear surface of the substrate in Step S117, at the same depth as that in Example 2. A method for manufacturing the comparative example is the same as the method for manufacturing Example 2 except that laser annealing in Step S117 is not performed.

The results illustrated in FIG. 28 proved that, in the comparative example (laser annealing was not performed), the impurity concentration of a portion of the $n^-$ drift region 1 which was interposed between the n buffer layers 15a and 15b was higher than the impurity concentration of the portion ($n^-$ drift region 1) which has a uniform impurity concentration distribution at the position deeper than a position with the impurity concentration peak of the n buffer layer 15a. In contrast, in Example 2 (laser annealing is performed), impurity concentration at the interface between the $n^-$ drift region 1 and the n buffer layer 15a is substantially equal to the impurity concentration of the portion ($n^-$ drift region 1) which has a uniform impurity concentration distribution at the position deeper than a position with the impurity concentration peak of the n buffer layer 15a. That is, the results proved that it was possible to form the n buffer layer 15, without changing the impurity concentration of the $n^-$ drift region 1.

The results proved that, when proton irradiation and activation annealing were performed in Steps S118 and S119 after laser annealing was performed on the rear surface of the substrate in Step S117, it was possible to prevent a variation in donor concentration, as illustrated in FIG. 28.

As described above, according to Embodiment 13, it is possible to obtain the same effect as that in Embodiments 1 to 4, 11, and 12.

Embodiment 14

Figure 27:
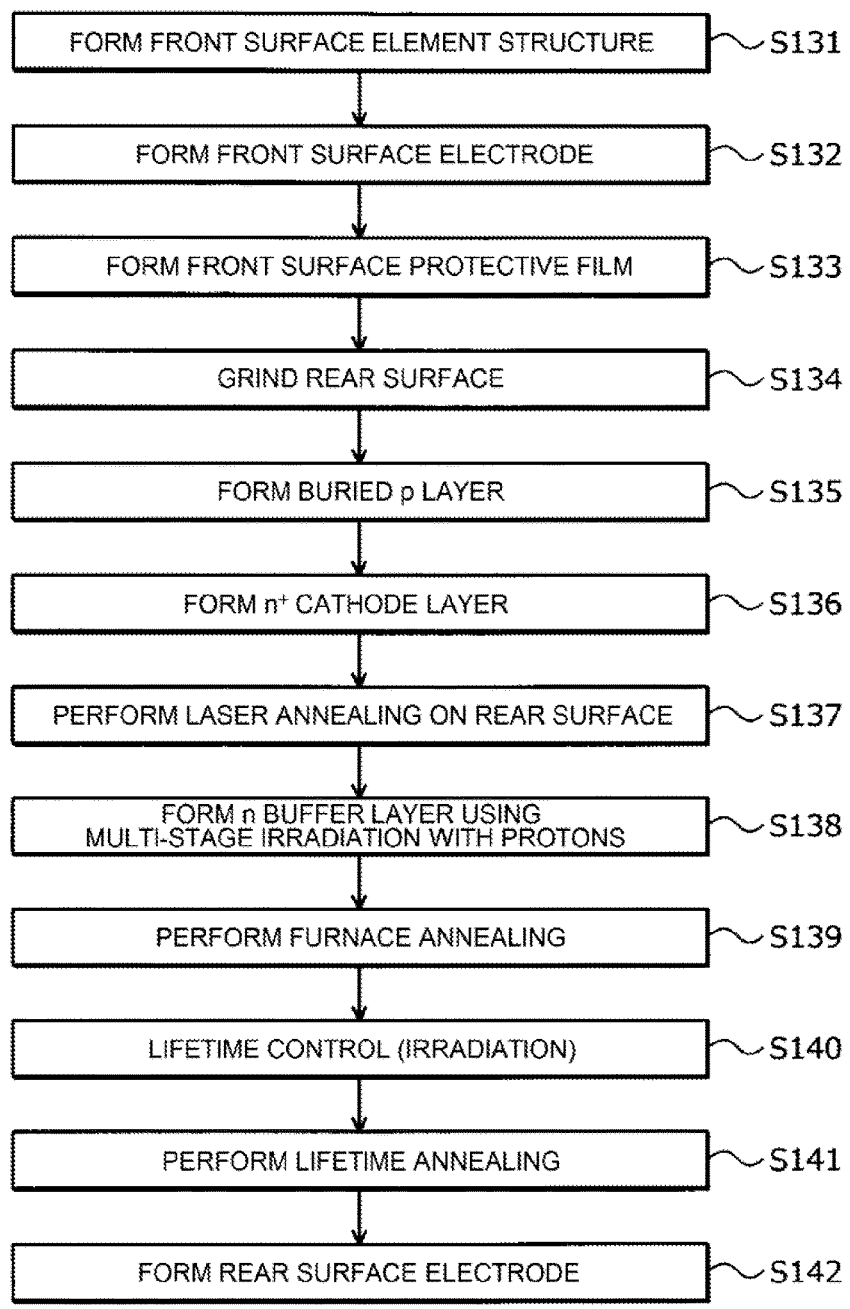
FIG. 27 is a flowchart illustrating the outline of a semiconductor device manufacturing method according to Embodiment 14.

Next, a semiconductor device manufacturing method according to Embodiment 14 will be described. FIG. 27 is a flowchart illustrating the semiconductor device manufacturing method according to Embodiment 14. The semiconductor device manufacturing method according to Embodiment 14 differs from the semiconductor device manufacturing method according to Embodiment 13 in that, after a buried p layer 6 is formed, an $n^+$ cathode layer 4 is formed.

Specifically, first, similarly to Embodiment 13, a process from the formation of a front surface element structure to the grinding of the rear surface of an $n^-$ semiconductor substrate is formed (Step S131 to S134). Then, the buried p layer 6 is formed (Step S135) and then the $n^+$ cathode layer 4 is formed (Step S136). A method for forming the buried p layer 6 and a method for forming the $n^+$ cathode layer 4 are the same as those in Embodiment 13. Then, similarly to Embodiment 13, a process from laser annealing for activating the $n^+$ cathode layer 4 and the buried p layer 6 to the formation of a cathode electrode 7 is performed (Steps S137 to S142). In this way, the FWD illustrated in FIG. 8 is completed.

As described above, according to Embodiment 14, it is possible to obtain the same effect as that in Embodiments 1 to 4 and 11 to 13.

Various modifications and changes of the invention can be made. In each of the above-described embodiments, for example, the dimensions or impurity concentration of each component varies depending on, for example, required specifications. In each of the above-described embodiments, the lifetime of the carrier is controlled by electron beam irradiation. However, the invention is not limited thereto. For example, metal particles, such as platinum (Pt) particles, may be diffused to control the lifetime of the carrier, or particle beams, such as protons or helium (He) ions, other than the electron beams may be radiated to the semiconductor substrate to control the lifetime of the carrier. In addition, in each of the above-described embodiments, the first conductivity type is an n type and the second conductivity type is a p type. However, in the invention, the first conductivity type may be a p type and the second conductivity type may be an n type. In this case, the same effect as described above is obtained.

INDUSTRIAL APPLICABILITY

As described above, the semiconductor device according to the invention is useful for a power semiconductor device which is used in, for example, a power conversion apparatus.

EXPLANATIONS OF LETTERS OR NUMERALS 1 n⁻ DRIFT REGION
1a SIDE SURFACE OF n⁻ SEMICONDUCTOR SUBSTRATE
2 p⁺ ANODE LAYER
3 ANODE ELECTRODE
3a END PORTION OF ANODE CONTACT
4, 14 n⁺ CATHODE LAYER
5, 15, 15a to 15c n BUFFER LAYER
6 BURIED p LAYER
6a END PORTION OF BURIED p LAYER
7 CATHODE ELECTRODE
9 INTERLAYER INSULATING FILM
10 ACTIVE REGION
11 EDGE TERMINATION STRUCTURE PORTION
14a END PORTION OF n⁺ CATHODE LAYER
16 p⁻ REGION
16a OUTER CIRCUMFERENTIAL END PORTION OF p⁻ REGION
16b INNER CIRCUMFERENTIAL END PORTION OF p⁻ REGION

The invention claimed is:

1. A semiconductor device comprising:
a substrate having one surface and another surface opposite the one surface;
a first semiconductor region of a first conductivity type and formed in the substrate;
a second semiconductor region of a second conductivity type, the second semiconductor region being selectively provided in a first surface layer, that includes the one surface, of the substrate;
a first electrode in contact with the second semiconductor region to form a junction between the second semiconductor region and the first electrode;
a third semiconductor region of the first conductivity type and provided in a second surface layer, that includes the another surface, of the substrate, the third semiconductor region having a higher impurity concentration than that of the first semiconductor region;
a fourth semiconductor region of the second conductivity type and provided in the substrate at a location deeper than the third semiconductor region from the another surface; and
a second electrode in contact with the third semiconductor region,
an end portion of the fourth semiconductor region being located at a position that is at least a diffusion length of a minority carrier toward an inside from an end portion of the junction between the second semiconductor region and the first electrode.

2. The semiconductor device according to claim 1, further comprising:
a fifth semiconductor region of the first conductivity type and provided in the substrate so as to extend from the another surface to a position deeper from the another surface than that of the third semiconductor region, the fifth semiconductor region having an impurity concentration that is higher than the impurity concentration of the first semiconductor region and is lower than the impurity concentration of the third semiconductor region,
wherein an end portion of the third semiconductor region is located further inward than a side surface of the first semiconductor region, and
the fifth semiconductor region and the second electrode contact each other at a position further outward than a position of the third semiconductor region.

3. The semiconductor device according to claim 2, further comprising a sixth semiconductor region of the second conductivity type, the sixth semiconductor region being provided in the fifth semiconductor region to be further outward than the third semiconductor region so as to be separated from the third semiconductor region and the fourth semiconductor region.

4. The semiconductor device according to claim 2,
wherein the fifth semiconductor region is formed by a plurality of proton irradiation processes to include a plurality of the fifth semiconductor regions, and
the plurality of the fifth semiconductor regions are arranged at different depths from the another surface of the first semiconductor region.

5. The semiconductor device according to claim 2, wherein the end portion of the fourth semiconductor region is located further inward than the end portion of the third semiconductor region.

6. The semiconductor device according to claim 2, wherein the contact between the fifth semiconductor region and the second electrode is a Schottky junction.

7. The semiconductor device according to claim 1, wherein an occupation area ratio of a total surface area of the fourth semiconductor region to a total surface area of an active region in which a main current flows is
equal to or greater than 90%, and
equal to or less than 98%.

8. The semiconductor device according to claim 1,
wherein a contact end portion is defined by a plane that projects through the end portion of the junction and from the one surface to the another surface,
wherein a first occupation area ratio is defined as a total surface area of only portions of the fourth semiconductor region that are further inward relative to the contact end portion, to a total surface area of an active region in which a main current flows,
wherein a second occupation area ratio is defined as a total surface area of only portions of the fourth semiconductor region that are further outward relative to the contact end portion, to a total surface area of an edge termination structure portion,
further wherein the first occupation area ratio is higher than the second occupation area ratio.

9. The semiconductor device according to claim 1,
wherein a contact end portion is defined by a plane that projects through the end portion of the junction and from the one surface to the another surface,
wherein a length of the fourth semiconductor region, which is further inward relative to the contact end portion, measured along a direction parallel to the another surface is equal to or greater than 250 μm.

10. The semiconductor device according to claim 1,
wherein a contact end portion is defined by a plane that projects through the end portion of the junction and from the one surface to the another surface, wherein the fourth semiconductor region is located further inward relative to the contact end portion, and a distance of a separation portion between the contact end portion and the end portion of the fourth semiconductor region has a length equal to or less than 2000 µm.

11. The semiconductor device according to claim 1, further comprising a fifth semiconductor region of the first conductivity type provided in the substrate at a position deeper than the fourth semiconductor region from the another surface so as to be separated from the fourth semiconductor region, the fifth semiconductor region having an impurity concentration that is higher than the impurity concentration of the first semiconductor region and that is lower than the impurity concentration of the third semiconductor region.

12. The semiconductor device according to claim 1, wherein the fourth semiconductor region has a planar shape in which at least two sides are parallel to two sides of the first semiconductor region having a rectangular shape in a plan view, the two sides of the first semiconductor region sharing a vertex, and a connection portion between the two sides of the fourth semiconductor region is located further inward than an intersection point of the two sides of the first semiconductor region.

13. The semiconductor device according to claim 1, further comprising:
an active region in which a main current flows; and
a termination structure portion which surrounds the active region and holds a breakdown voltage,
wherein the fourth semiconductor region is provided in the active region, and
an avalanche breakdown voltage of the active region is less than an avalanche breakdown voltage of the termination structure portion.

14. The semiconductor device according to claim 1, wherein all of the fourth semiconductor region is disposed directly underneath the first electrode.

15. The semiconductor device according to claim 1, wherein the fourth semiconductor region is disposed directly underneath a center of the first electrode.

16. The semiconductor device according to claim 1, wherein the fourth semiconductor region is disposed directly above the third semiconductor region.

17. A semiconductor device comprising:
a substrate having one surface and another surface opposite the one surface;
a first semiconductor region of a first conductivity type and formed in the substrate;
a second semiconductor region of a second conductivity type, the second semiconductor region being selectively provided in a first surface layer, that includes the one surface, of the substrate;
a first electrode in contact with the second semiconductor region to form a junction between the second semiconductor region and the first electrode;
a third semiconductor region of the first conductivity type and provided in a second surface layer, that includes the another surface, of the substrate, the third semiconductor region having a higher impurity concentration than that of the first semiconductor region;
a fourth semiconductor region of the second conductivity type and provided in the substrate at a location deeper than the third semiconductor region from the another surface; and
a second electrode in contact with the third semiconductor region,
an end portion of the fourth semiconductor region being located at a position that is at least a diffusion length of a minority carrier toward an inside from an end portion of the junction between the second semiconductor region and the first electrode,
wherein a contact end portion is defined by a plane that projects through the end portion of the junction and from the one surface to the another surface,
further wherein a length L1 of the fourth semiconductor region, which is further inward relative to the contact end portion, measured along a direction parallel to the another surface satisfies the following expression:

$$L1 \geq \{(q \cdot \mu \cdot d \cdot Np \cdot Vbi)/J\}^{1/2}$$

where in the expression,
J is a current density of a main current of the semiconductor device,
q is an elementary charge,
µ is hole mobility,
d is a thickness of the fourth semiconductor region in a depth direction,
Np is an impurity concentration of the fourth semiconductor region, and
Vbi is a built-in potential of a pn junction between the fourth semiconductor region and the third semiconductor region.

18. A semiconductor device comprising:
a substrate having one surface and another surface opposite the one surface;
a first semiconductor region of a first conductivity type and formed in the substrate;
a second semiconductor region of a second conductivity type, the second semiconductor region being selectively provided in a first surface layer, that includes the one surface, of the substrate;
a first electrode in contact with the second semiconductor region to form a junction between the second semiconductor region and the first electrode;
a third semiconductor region of the first conductivity type and provided in a second surface layer, that includes the another surface, of the substrate, the third semiconductor region having a higher impurity concentration than that of the first semiconductor region;
a fourth semiconductor region of the second conductivity type and provided in the substrate at a location deeper than the third semiconductor region from the another surface;
a field limiting ring disposed in the first surface layer, an end portion of said junction being located at a position that is toward an inside of the device from the field limiting ring; and
a second electrode in contact with the third semiconductor region,
an end portion of the fourth semiconductor region being located at a position that is toward said inside from said end portion of said junction.

19. The semiconductor device according to claim 18, wherein all of the fourth semiconductor region is disposed directly underneath the first electrode.

20. The semiconductor device according to claim 18, wherein the fourth semiconductor region is disposed directly underneath a center of the first electrode.

21. The semiconductor device according to claim 18, wherein the fourth semiconductor region is disposed directly above the third semiconductor region.

* * * * *